US012538691B2

(12) United States Patent
Kim et al.

(10) Patent No.: US 12,538,691 B2
(45) Date of Patent: Jan. 27, 2026

(54) LIGHT EMITTING DISPLAY PANEL WITH MULTIPLE CATHODE ELECTRODES AND LIGHT EMITTING DISPLAY APPARATUS USING THE SAME

(71) Applicant: LG Display Co., Ltd., Seoul (KR)

(72) Inventors: MoonSoo Kim, Paju-si (KR); Sungbin Shim, Paju-si (KR); Saemleenuri Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 322 days.

(21) Appl. No.: 17/519,314

(22) Filed: Nov. 4, 2021

(65) Prior Publication Data

US 2022/0149318 A1    May 12, 2022

(30) Foreign Application Priority Data

Nov. 9, 2020 (KR) ........................ 10-2020-0148673

(51) Int. Cl.
*H10K 59/80*    (2023.01)
*H10K 59/12*    (2023.01)
*H10K 59/122*   (2023.01)

(52) U.S. Cl.
CPC ..... *H10K 59/8052* (2023.02); *H10K 59/1201* (2023.02); *H10K 59/122* (2023.02);
(Continued)

(58) Field of Classification Search
None
See application file for complete search history.

(56) References Cited

U.S. PATENT DOCUMENTS 9,356,078 B2    5/2016 Han et al.
2013/0015450 A1*  1/2013 Kim ............ H10K 59/38
                                                       257/40
(Continued)

FOREIGN PATENT DOCUMENTS

KR    10-2010-0052810 A    5/2010
KR    10-2013-0009699 A    1/2013
(Continued)

OTHER PUBLICATIONS

Office Action dated Jun. 13, 2024, issued in corresponding Korean Patent Application No. 10-2020-0148673.

*Primary Examiner* — Sue A Purvis
*Assistant Examiner* — Seyon Ali-Simah Punchbeddell
(74) *Attorney, Agent, or Firm* — Morgan, Lewis & Bockius LLP

(57) ABSTRACT

A disclosed light emitting display panel includes: a substrate; a plurality of pixel driving circuits on the substrate; a planarization layer on the pixel driving circuits; a plurality of anode electrodes on the planarization layer, each of the plurality of anode electrodes being electrically connected with a corresponding one of the pixel driving circuits; a plurality of banks on the planarization layer and including at least one first region bank between two adjacent anode electrodes among the plurality of anode electrodes; a light emitting layer on the plurality of anode electrodes and on the banks; a first cathode electrode on the light emitting layer and including a low resistance area electrode and at least one high resistance area electrode having a higher resistance than the low resistance area electrode; and a second cathode electrode on the first cathode electrode.

15 Claims, 16 Drawing Sheets

(52) U.S. Cl.
CPC . *H10K 59/80521* (2023.02); *H10K 59/80524* (2023.02); *H10K 59/873* (2023.02)

(56) References Cited

U.S. PATENT DOCUMENTS

| | | | | |
|---|---|---|---|---|
| 2014/0103385 | A1* | 4/2014 | Hatano | H10K 50/19 438/28 |
| 2015/0318334 | A1* | 11/2015 | Kim | H10K 50/822 257/40 |
| 2016/0079334 | A1* | 3/2016 | Lee | H10K 71/00 438/34 |
| 2016/0218314 | A1* | 7/2016 | Kim | H10K 59/122 |
| 2018/0006106 | A1* | 1/2018 | Oh | H10K 50/824 |
| 2018/0083221 | A1* | 3/2018 | Kim | H10K 59/80524 |
| 2018/0183016 | A1* | 6/2018 | Kuwabara | H10K 71/00 |
| 2021/0335960 | A1* | 10/2021 | Feng | H10K 50/824 |

FOREIGN PATENT DOCUMENTS

| | | |
|---|---|---|
| KR | 10-2015-0026058 A | 3/2015 |
| KR | 10-2015-0033141 A | 4/2015 |
| KR | 10-2016-0093175 A | 8/2016 |

\* cited by examiner

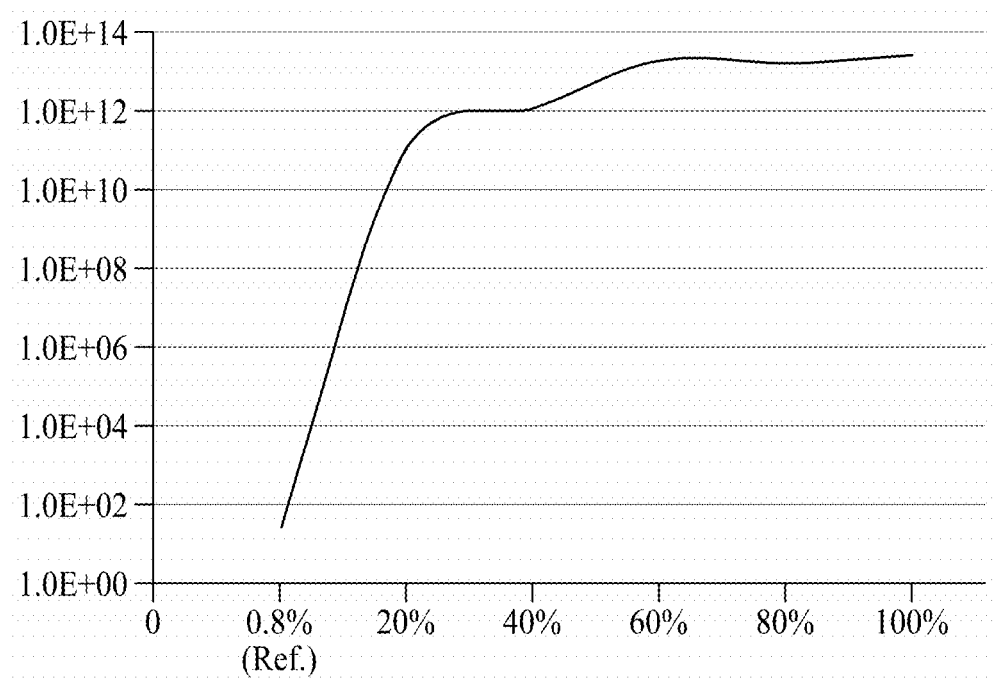

LIGHT EMITTING DISPLAY PANEL WITH MULTIPLE CATHODE ELECTRODES AND LIGHT EMITTING DISPLAY APPARATUS USING THE SAME

CROSS-REFERENCE TO RELATED APPLICATIONS

This application claims the benefit of and the priority to Korean Patent Application No. 10-2020-0148673 filed on Nov. 9, 2020, which is hereby incorporated by reference as if fully set forth herein.

BACKGROUND

1. Technical Field

The present disclosure relates to a light emitting display panel and a light emitting display apparatus using the same.

2. Description of the Related Art

A light emitting display apparatus is a display apparatus for outputting light with the use of a light emitting device. A light emitting display apparatus may include a light emitting display panel with light emitting devices.

As the light emitting display panel has a relatively high resolution, an undesired lighting (point) may be generated by a lateral leakage current (LLC) between adjacent pixels.

The lateral leakage current between the adjacent pixels may be generated by a cathode electrode continuously disposed across the adjacent pixels.

SUMMARY

Accordingly, the present disclosure is directed to a light emitting display panel and a light emitting display apparatus using the same that substantially obviate one or more problems due to limitations and disadvantages of the related art.

It is an object of the present disclosure to provide a light emitting display panel in which a first cathode electrode adjacent to a light emitting layer, which is selected from two cathode electrodes, is patterned in an upper end of a bank and to provide a light emitting display apparatus using such a light emitting display panel.

In addition to the objects of the present disclosure as mentioned above, additional objects and features of the present disclosure will be clearly understood by those skilled in the art from the following description of the present disclosure.

To achieve these objects and other advantages and in accordance with the purpose of the present disclosure, as embodied and broadly described herein, a light emitting display panel may comprise: a substrate; a plurality of pixel driving circuits on the substrate; a planarization layer on the pixel driving circuits; a plurality of anode electrodes on the planarization layer, each of the plurality of anode electrodes being electrically connected with a corresponding one of the pixel driving circuits; a plurality of banks on the planarization layer and including at least one first region bank between two adjacent anode electrodes among the plurality of anode electrodes; a light emitting layer on the plurality of anode electrodes and on the banks; a first cathode electrode on the light emitting layer and including a low resistance area electrode and at least one high resistance area electrode having a higher resistance than the low resistance area electrode; and a second cathode electrode on the first cathode electrode.

In an example embodiment of the present disclosure, the banks may surround the plurality of anode electrodes, and the at least one high resistance area electrode may be disposed on the at least one first region bank, which is between the two adjacent anode electrodes in a first direction of the substrate.

In an example embodiment of the present disclosure, the pixel driving circuits may include a plurality of gate lines extending along the first direction of the substrate.

In an example embodiment of the present disclosure, the banks may surround the plurality of anode electrodes, the banks include a plurality of first region banks, and the at least one high resistance area electrode may be disposed on at least one of the first region banks but not on another of the first region banks.

In an example embodiment of the present disclosure, the substrate may include a plurality of pixels, each of the pixels including a corresponding one of the plurality of anode electrodes. The pixels may include a red pixel, a green pixel, a white pixel, and a one blue pixel sequentially disposed along a first direction. The at least one high resistance area electrode may be disposed on the at least one of the first region banks between the white pixel and the blue pixel in the first direction, but not disposed on the another of the first region banks between the red pixel and the green pixel or between the green pixel and the white pixel.

In an example embodiment of the present disclosure, the first cathode electrode layer may include a plurality of high resistance area electrodes, the high resistance area electrodes being on the banks and surrounding the anode electrodes.

In an example embodiment of the present disclosure, the above light emitting display panel may further comprise a light compensation layer between the first cathode electrode and the second cathode electrode.

In an example embodiment of the present disclosure, the light compensation layer may include at least one of TiOx, SiNx, SiO$_2$, TaO$_2$, NIOx, MgF and CaF.

In an example embodiment of the present disclosure, the light compensation layer may be disposed between the banks and be spaced apart from the at least one high resistance area electrode in a plan view. The low resistance area electrode and the second cathode electrode may be connected with each other at a contact area of the low resistance area electrode between the light compensation layer and the at least one high resistance area electrode in the plan view.

In an example embodiment of the present disclosure, each of the pixel driving circuits may include at least one of a switching transistor, a driving transistor, a sensing transistor, and a storage capacitor.

In an example embodiment of the present disclosure, the first cathode electrode may be a transparent electrode, and the amount of oxygen in the at least one high resistance area electrode may be larger than the amount of oxygen in the low resistance area electrode.

In an example embodiment of the present disclosure, the above light emitting display panel may further comprise: a protection layer on the second cathode electrode; a color filter on a portion of the protection layer above the plurality of anode electrodes; and a black matrix on another portion of the protection layer above the banks, wherein the light emitting layer is configured to output white light.

In another aspect of the present disclosure, a light emitting display apparatus may comprise: the light emitting display panel described above; a data driver configured to supply data voltages to data lines disposed in the light emitting display panel; a gate driver configured to supply a gate voltage to gate lines disposed in the light emitting display panel; and a controller configured to control the data driver and the gate driver.

In yet another aspect of the present disclosure, a method of manufacturing a display panel may comprise: forming a plurality of pixel driving circuits on a substrate; forming a planarization layer on the pixel driving circuits; forming a plurality of anode electrodes on the planarization layer, each of the plurality of anode electrodes being electrically connected with a corresponding one of the pixel driving circuits; forming a plurality of banks on the planarization layer, the banks including at least one first region bank between two adjacent anode electrodes among the plurality of anode electrodes; forming a light emitting layer on the plurality of anode electrodes and on the banks; forming a first cathode electrode on the light emitting layer, the first cathode electrode including a low resistance area electrode and at least one high resistance area electrode having a higher resistance than the low resistance area electrode; and forming a second cathode electrode on the first cathode electrode.

In an example embodiment of the present disclosure, the banks may be formed to surround the plurality of anode electrodes, and the at least one high resistance area electrode may be formed on the at least one first region bank.

In an example embodiment of the present disclosure, the forming of the first cathode electrode may include: forming a first cathode electrode layer on the light emitting layer; forming a mask on a portion of the first cathode electrode layer above at least one of the plurality of anode electrodes; and injecting oxygen into the first cathode electrode layer using the mask covering the portion of the first cathode electrode layer.

In an example embodiment of the present disclosure, the portion of the first cathode electrode layer covered by the mask during the injecting of oxygen may form a portion of the low resistance area electrode, and another portion of the first cathode electrode layer not covered by the mask during the injecting of oxygen may form the at least one high resistance area electrode.

In an example embodiment of the present disclosure, the forming of the second cathode electrode may include forming the second cathode electrode on the first cathode electrode and on the mask. The mask may be a light compensation layer between the first cathode electrode and the second cathode electrode.

In an example embodiment of the present disclosure, the at least one high resistance area may be formed spaced apart from the light compensation layer a plan view. The second cathode electrode may be formed to contact the low resistance area electrode at a contact area of the low resistance area electrode between the light compensation layer and the at least one high resistance area electrode in the plan view.

In an example embodiment of the present disclosure, the above method may further comprise removing the mask after the injecting of oxygen and before the forming of the second cathode electrode, wherein the mask may be a pattern layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiment(s) of the disclosure and together with the description serve to explain the principles of the disclosure. In the drawings:

FIG. 7 is a graph showing a relationship between the amount of oxygen and a surface resistance in an example high resistance area electrode disposed on the light emitting display panel according to an example embodiment of the present disclosure;

DETAILED DESCRIPTION

Figure 1:
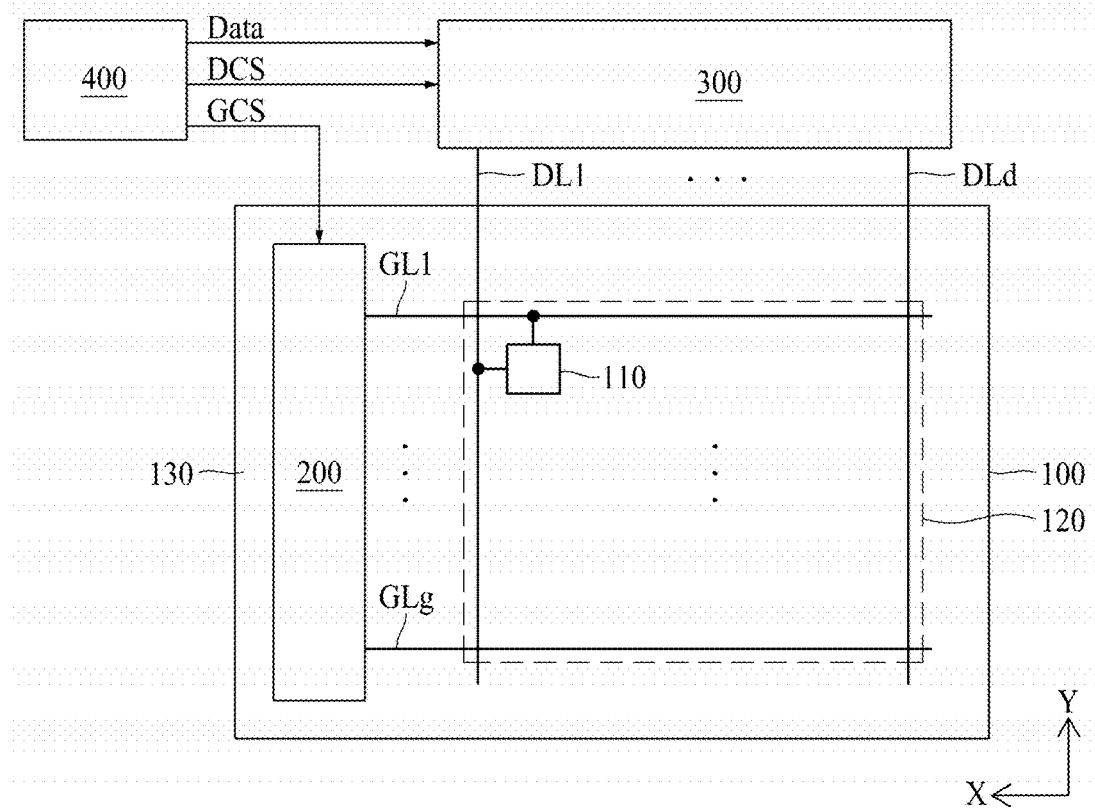
FIG. 1 illustrates a light emitting display apparatus according to an example embodiment the present disclosure.

Reference will now be made in detail to embodiments of the present disclosure, examples of which are illustrated in the accompanying drawings.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. The same or similar elements are designated by the same reference numerals throughout the specification unless otherwise specified.

In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, a display panel and a display apparatus using the same according to example embodiments of the present disclosure will be described in detail with reference to the accompanying drawings. In the drawings, the same or similar elements may be denoted by the same reference numerals even though they are depicted in different drawings.

Hereinafter, example embodiments of the present disclosure will be described in detail with reference to the accompanying drawings.

Figure 2:
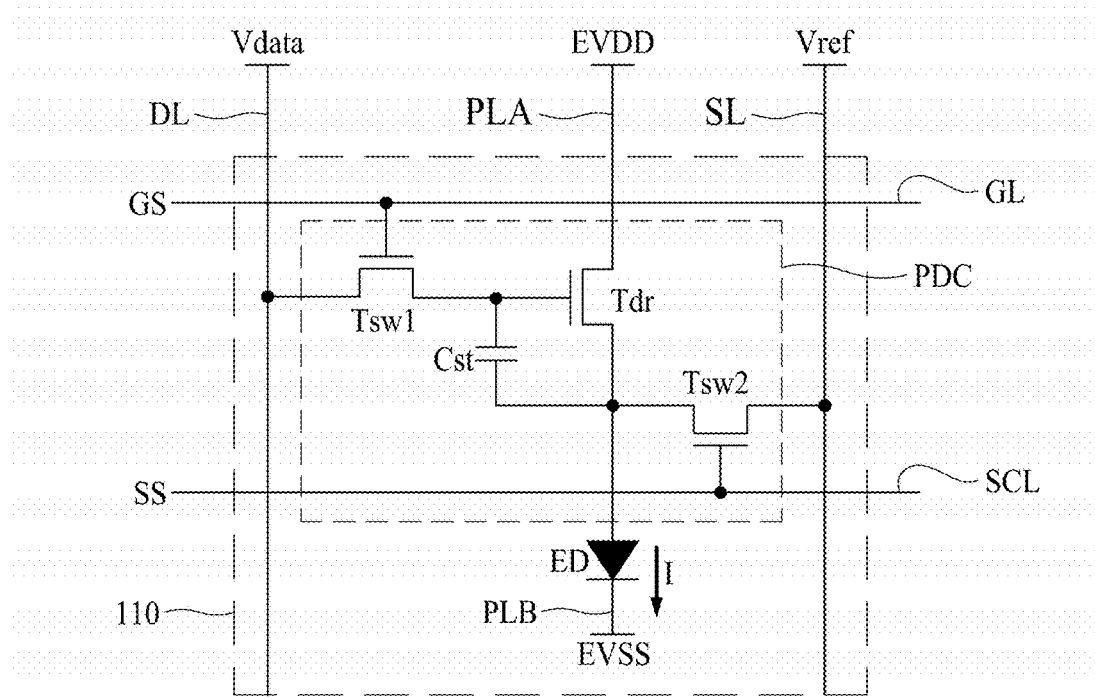
FIG. 2 illustrates an example pixel structure employed in a light emitting display apparatus according to an example embodiment of the present disclosure.

FIG. 1 illustrates a light emitting display apparatus according to an example embodiment the present disclosure. FIG. 2 illustrates an example pixel structure employed in a light emitting display apparatus according to an example embodiment of the present disclosure.

The light emitting display apparatus according to an example embodiment the present disclosure may constitute any of various electronic devices. For example, the electronic device may be a smartphone, a tablet PC, a television, a monitor, or the like.

As shown in FIG. 1, the light emitting display apparatus according to an example embodiment of the present disclosure may include a light emitting display panel 100 having a display area 120 configured to output an image and a non-display area 130 provided in the periphery of the display area 120. The apparatus may further include a gate driver 200 configured to supply gate signals to gate lines GL1 to GLg provided in the display area 120 of the light emitting display panel 100, a data driver 300 configured to supply data voltages to data lines DL1 to DLd provided in the light emitting display panel 100, and a controller 400 configured to control an operation in each of the gate driver 200 and the data driver 300.

First, the light emitting display panel 100 may include the display area 120 and the non-display area 130. In the display area 120, there are the gate lines GL1 to GLg, the data lines DL1 to DLd, and pixels 110.

As shown in FIG. 2, an example pixel 110 provided in the light emitting display panel 100 may include a light emitting device ED, a switching transistor Tsw1, a storage capacitor Cst, a driving transistor Tdr, and a sensing transistor Tsw2. The pixel 110 may include a pixel driving circuit PDC and a light emitting portion. The pixel driving circuit PDC may include the switching transistor Tsw1, the storage capacitor Cst, the driving transistor Tdr, and the sensing transistor Tsw2. The light emitting portion may include the light emitting device ED.

The light emitting device ED may include any one of an organic light emitting layer, an inorganic light emitting layer, and a quantum dot light emitting layer. Alternatively, the light emitting device ED may include a stack or mixed structure of the organic light emitting layer (or inorganic light emitting layer) and the quantum dot light emitting layer.

The light emitting device ED may output light corresponding to any one of various colors, such as red, green, and blue. Alternatively, the light emitting device ED may output white light.

The switching transistor Tsw1 in the pixel driving circuit PDC may be turned on or off by the gate signal GS supplied to the gate line GL. The data voltage Vdata supplied through the data line DL may be supplied to the driving transistor Tdr when the switching transistor Tsw1 is turned on. A first voltage EVDD may be supplied to the driving transistor Tdr and the light emitting device ED through a first voltage supply line PLA. A second voltage EVSS may be supplied to the light emitting device ED through a second voltage supply line PLB. The sensing transistor Tsw2 may be turned on or off by a sense control signal SS supplied through a sensing control line SCL. A sensing line SL may be connected to the sensing transistor Tsw2. A reference voltage Vref may be supplied to the pixel 110 through the sensing line SL. The sensing signal related with the characteristic change of the driving transistor Tdr may be transmitted to the sensing line SL through the sensing transistor Tsw2.

Although the pixel 110 according to the present disclosure may be formed as the example structure shown in FIG. 2, it is not limited thereto. Accordingly, the pixels applied to the present disclosure may be changed in various forms in addition to the example structure shown in FIG. 2.

The light emitting display panel 100 may form a pixel area in which the pixels 110 are formed. In the pixel area, there may be signal lines configured to supply various signals to the pixel driving circuit PDC provided in the pixels 110.

In the example light emitting display panel including the pixel 110 shown in FIG. 2, the signal lines may include the gate line GL, the data line DL, the sensing control line SCL, the first voltage supply line PLA, the second voltage supply line PLB, and the sensing line SL.

The data driver 300 may be provided on a chip-on film attached to the light emitting display panel 100. The data driver 300 may be connected to a main board provided with the controller 400. In this case, lines for electrically connecting the controller 400, the data driver 300, and the light emitting display panel 100 may be provided in the chip-on-film. To this end, the lines may be electrically connected to pads provided in the light emitting display panel 100 and the main board. The main board may be electrically connected to an external substrate on which an external system is mounted.

The data driver 300 may be directly mounted on the light emitting display panel 100 and may be electrically connected to the main board.

Alternatively, the data driver 300 may be formed with an integrated circuit together with the controller 400. The integrated circuit may be provided on the chip-on film or be directly mounted on the light emitting display panel 100.

The data driver 300 may receive the sensing signal related with the characteristic change of the driving transistor Tdr provided in the light emitting display panel 100 from the light emitting display panel 100 and may transmit the sensing signal to the controller 400.

The gate driver 200 may be composed of an integrated circuit and may be integrated with the non-display area 130. Alternatively, the gate driver 200 may be directly embedded in the non-display area 130 by a gate-in-panel (GIP) method. If the gate-in-panel (GIP) method is used, transistors constituting the gate driver 200 may be provided in the non-display area 130 through the same process as transistors provided in each of the pixels 110 in the display area 120.

When a gate pulse generated in the gate driver 200 is supplied to a gate of the switching transistor Tsw1 or Tsw provided in the pixel 110, the switching transistor is turned on. Accordingly, light may be output from the pixel 110. When a gate-off signal is supplied to the switching transistor Tsw1 or Tsw, the switching transistor is turned off. Accordingly, light is not output from the pixel 110. The gate signal GS supplied to the gate line GL may include the gate pulse and the gate-off signal.

The controller 400 may re-align the input image data transmitted from the external system based on a timing synchronized signal transmitted from the external system. In addition, the controller 400 may include a data aligner configured to supply the re-aligned image data to the data driver 300; a control signal generator configured to generate a gate control signal GCS and a data control signal DCS based on the timing synchronized signal; an input portion configured to receive the timing synchronized signal and input image data transmitted from the external system and to transmit the received timing synchronized signal and input image data to the data aligner and the control signal generator; and an output portion configured to output the image data Data generated in the data aligner and the control signals DCS and GCS generated in the control signal generator to the data driver 300 or the gate driver 200.

The controller 400 may be embedded in the light emitting display panel 100 or may be attached to the light emitting display panel 100. Alternatively, the controller 400 may further perform a function of analyzing touch sensing signals received through a touch panel and a function of sensing whether or not there is a touch and a touch position.

The external system may perform a function of driving the controller 400 and the electronic device. For example, if the electronic device is a smartphone, the external system may receive various voice information, image information, and text information through a wireless communication network, and transmit the received image information to the controller 400. The image information may be input image data.

Hereinafter, among the various light emitting display panels, the light emitting display panel having the example pixel structure shown in FIG. 2 is described as an example embodiment of the light emitting display panel according to the present disclosure.

Figure 3:
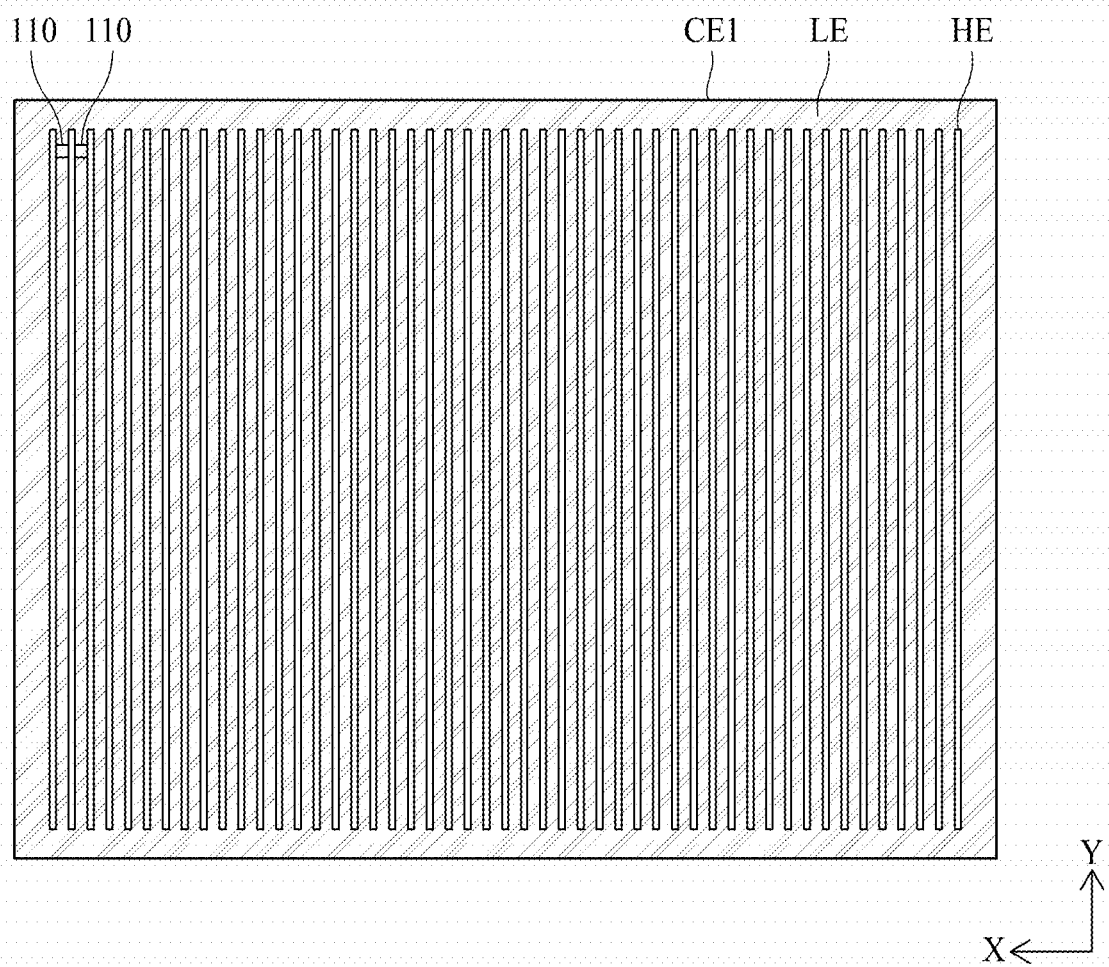
FIG. 3 is a plan view illustrating an example first cathode electrode of a light emitting display panel according to an example embodiment of the present disclosure.
Figure 4:
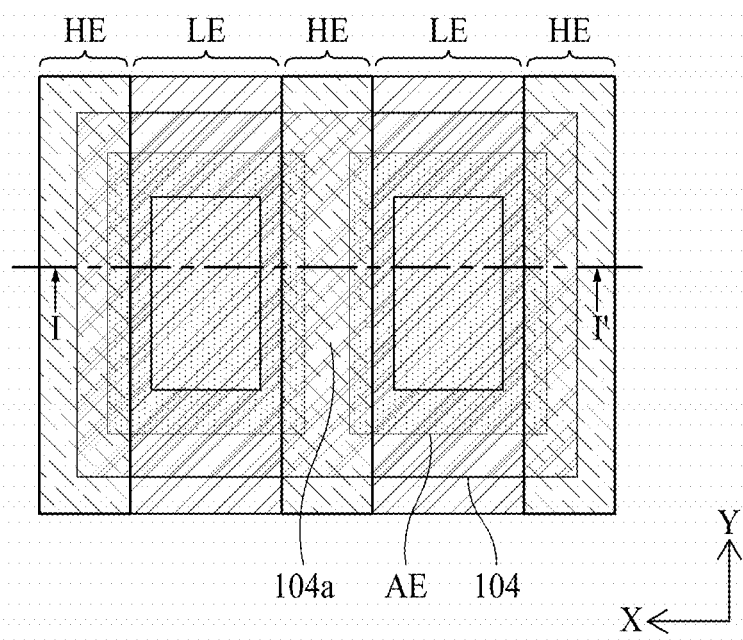
FIG. 4 is a plan view illustrating two pixels shown in FIG. 3.
Figure 5:
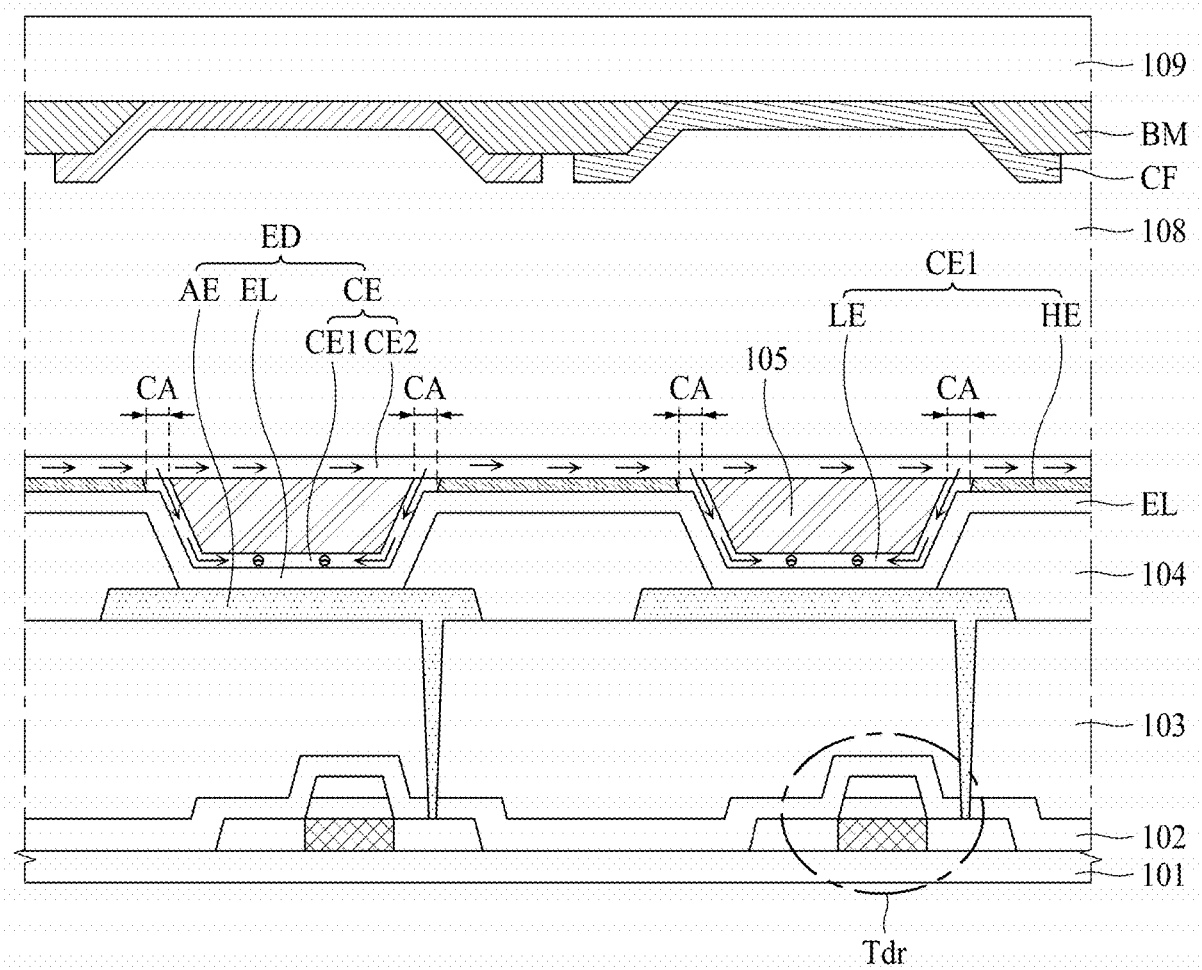
FIGS. 5 and 6 are cross sectional views of the light emitting display panel according to an example embodiment of the present disclosure taken along I-I' in FIG. 4.
Figure 6:
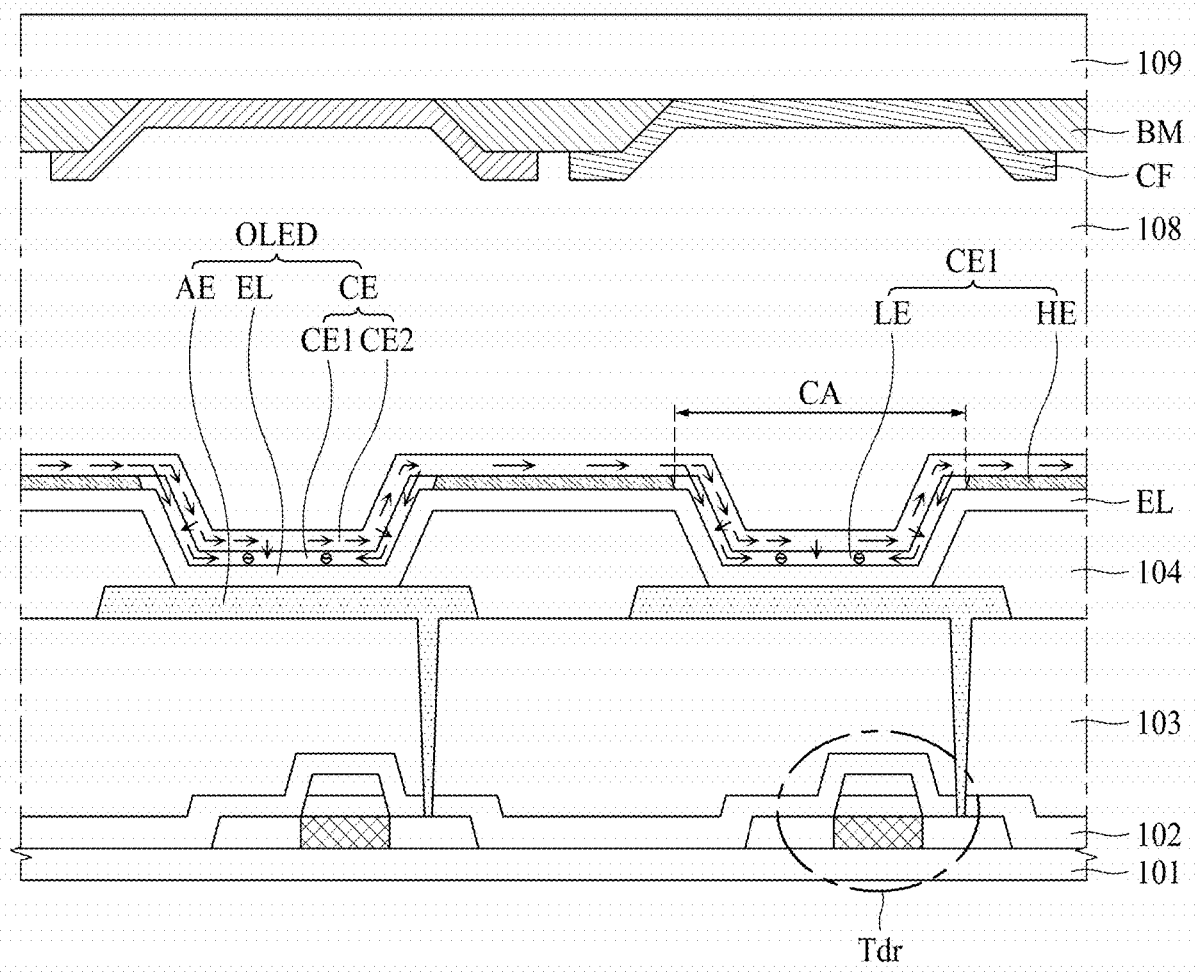
Figure 8A:
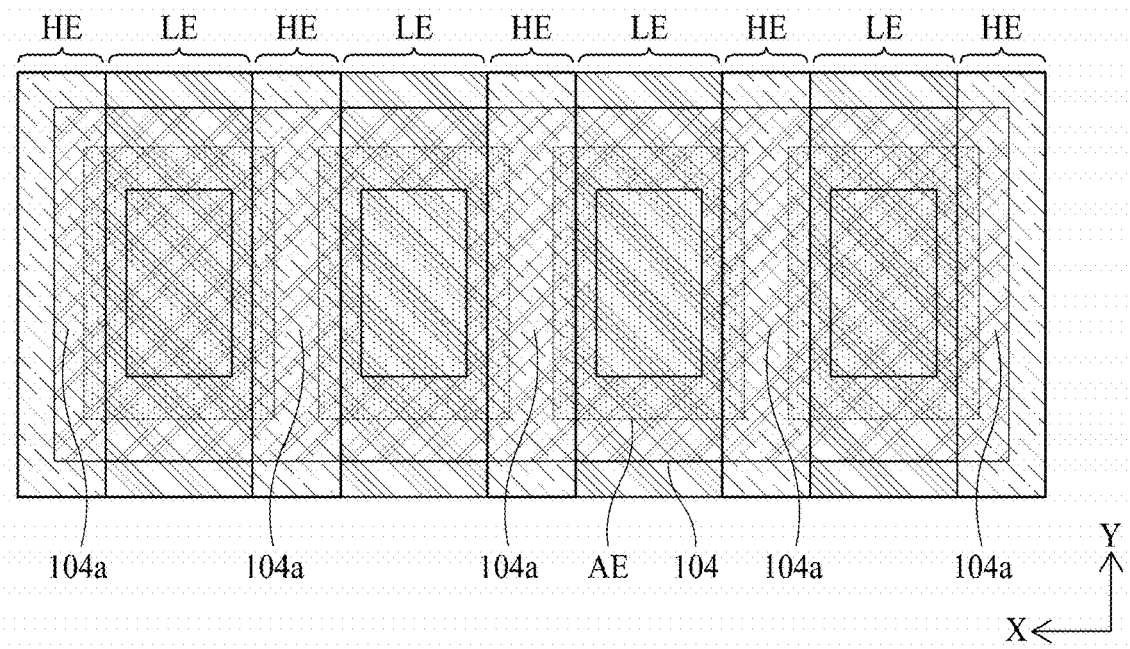
FIGS. 8A and 8B illustrate various example arrangements of high resistance area electrodes disposed on the light emitting display panel according to an example embodiment of the present disclosure.
Figure 8B:
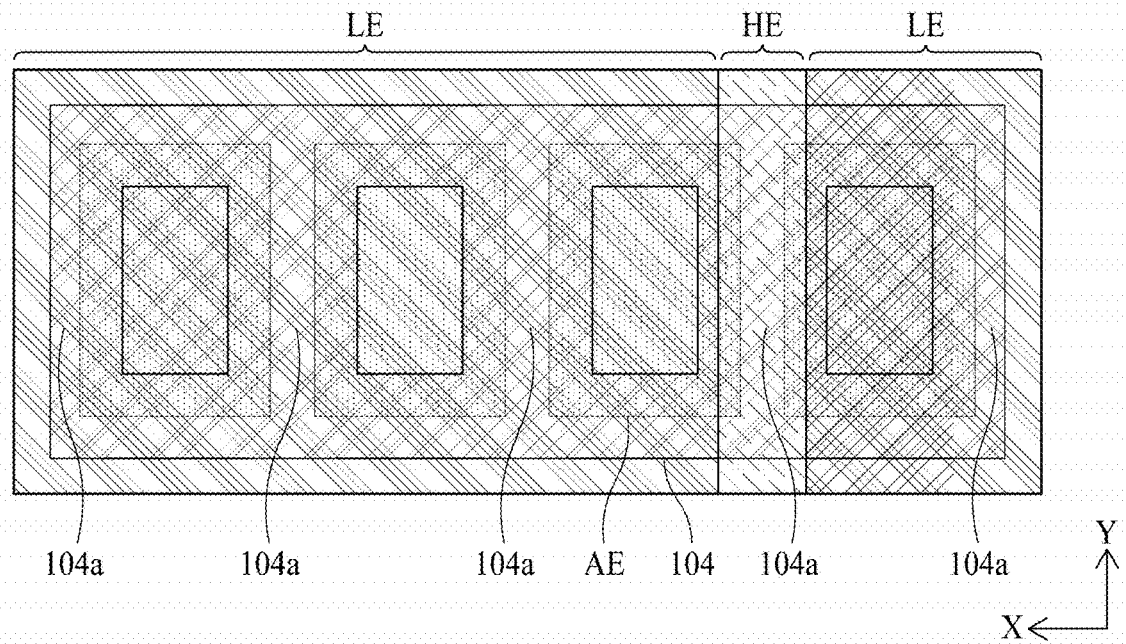

FIG. 3 is a plan view illustrating a first cathode electrode of a light emitting display panel according to an example embodiment of the present disclosure. FIG. 4 is a plan view illustrating two pixels 110 shown in FIG. 3. FIGS. 5 and 6 are cross sectional views of the light emitting display panel according to an example embodiment of the present disclosure along I-I' in FIG. 4. FIG. 7 is a graph showing a relationship between the amount of oxygen and a surface resistance in a high resistance area electrode disposed on the light emitting display panel according to an example embodiment of the present disclosure. FIGS. 8A and 8B are various examples of arrangement of high resistance area electrodes disposed on the light emitting display panel according to an example embodiment of the present disclosure. In FIG. 7, the horizontal axis represents the ratio of oxygen, and the vertical axis represents the surface resistance.

As shown in FIGS. 1 to 5, the light emitting display panel according to an example embodiment of the present disclosure may include a substrate 101, a pixel driving circuit layer 102 provided on the substrate 101 and configured to include a driving transistor Tdr, a planarization layer 103 covering the pixel driving circuit layer 102, anode electrodes AE provided on the planarization layer 103 in pixel areas, banks 104 disposed between the anode electrodes AE, a light emitting layer EL disposed on the anode electrodes AE and the banks 104, a first cathode electrode CE1 disposed on the light emitting layer EL, and a second cathode electrode CE2 disposed on the first cathode electrode CE1. Here, the first cathode electrode CE1 may include a low resistance area electrode LE having a first resistance value, and high resistance area electrodes HE having a second resistance value greater than the first resistance value. Each of the high resistance area electrodes HE may be provided on any one of the banks 104.

The substrate 101 may be a glass substrate or a plastic substrate, and may be formed of various kinds of films.

The pixel driving circuit layer 102 including the driving transistor Tdr may be provided on the substrate 101, as shown in FIGS. 5 and 6.

The pixel driving circuit layer 102 may be provided with a pixel driving circuit PDC having the driving transistor Tdr. As shown in FIG. 2 and described above, the pixel driving circuit PDC may also include a switching transistor Tsw1, a storage capacitor Cst, the driving transistor Tdr, and a sensing transistor Tsw2.

In the pixel driving circuit layer 102, there may be a data line DL, a gate line GL, a sensing control line SCL, a sensing line SL, and a first voltage supply line PLA, which may be connected to the pixel driving circuit PDC.

In FIGS. 5 and 6, the pixel driving circuit layer 102 having only the driving transistor Tdr is shown, whereby the pixel driving circuit layer 102 includes only one insulating film. However, the present disclosure is not limited thereto. One or more additional elements of the pixel driving circuit PDC, such as those shown in FIG. 2, and one or more insulating films may be provided in the pixel driving circuit layer 102 so that transistors and lines may be insulated.

Also, the pixel driving circuit layer 102 may further include a buffer disposed between the driving transistor Tdr and the substrate 101. Each of the buffer and the insulating films may be formed of at least one inorganic film or at least one organic film, or may be formed of at least one inorganic film and at least one organic film.

The planarization layer 103 may be provided on the pixel driving circuit layer 102. For example, the pixel driving circuit layer 102 may be provided with various kinds of transistors and signal lines for forming the pixel driving circuit PDC. In this case, the various kinds of transistors and signal lines may have different heights. In addition, in the pixel driving circuit layer 102, the height of the area in which the transistors and the signal lines are provided may be different from the height of the area in which the transistors and the signal lines are not provided. Due to this height difference, an upper surface formed by transistors and signal lines may not be flat. Accordingly, an upper surface of the pixel driving circuit layer 102 may not be flat.

The planarization layer 103 functions to planarize the upper surface of the pixel driving circuit layer 102. Thus, the upper surface of the planarization layer 103 may form a planarized surface. The planarization layer 103 may be formed to have a height greater than that of the pixel driving circuit layer 102.

The planarization layer 103 may be formed of at least one organic film but is not limited thereto. For example, the planarization layer 103 may be formed of at least one inorganic film and at least one organic film.

The anode electrodes AE may be provided on the upper surface of the planarization layer 103. The anode electrode AE may form a part of the light emitting device ED.

The anode electrode AE may be electrically connected to the driving transistor Tdr disposed in the pixel driving circuit layer 102 and may be patterned for each pixel.

The anode electrode AE may be one of the two electrodes constituting the light emitting device ED. For example, if the light emitting device ED is an organic light emitting diode, the organic light emitting diode may include a first pixel electrode, a light emitting layer EL disposed on an upper surface of the first pixel electrode, and a second pixel electrode disposed on an upper surface of the light emitting layer EL. The first pixel electrode may be the anode electrode AE, and the second pixel electrode may be a cathode electrode CE. In this case, the anode electrode AE may be connected to the driving transistor Tdr.

The anode electrode AE disposed on the planarization layer 103 may be electrically connected to the transistor or transistors disposed on the pixel driving circuit layer 102. For example, the anode electrode AE may be electrically connected to the driving transistor Tdr.

The anode electrode AE may be formed of a transparent electrode, such as indium tin oxide (ITO) or indium zinc oxide (IZO). Alternatively, the anode electrode AE may be formed of an opaque electrode such as copper (Cu). The anode electrode AE may be formed by stacking a transparent electrode and an opaque electrode.

If a method of outputting light in an upper surface direction of the anode electrode AE (i.e., away from the anode electrode AE) is used, the anode electrode AE may include at least one opaque electrode.

On the other hand, if a method of outputting light in a lower surface direction of the anode electrode AE (i.e., through the anode electrode AE) is used, the anode electrode AE may include at least one transparent electrode.

The bank 104 may cover the peripheral sides of the anode electrode AE, to thereby form an opening through which light may be output from one pixel. The bank 104 may be formed to surround the anode electrode AE, as shown in FIGS. 4 to 6.

The bank 104 may cover the ends of the anode electrode AE and expose the middle portion of anode electrode AE between the ends, and may otherwise be provided on the entire surface of the substrate 101. The bank 104 may prevent light from overlapping between adjacent pixels.

The bank 104 may be formed of at least one inorganic film or at least one organic film. Alternatively, the bank 104 may be formed by stacking at least one inorganic film and at least one organic film.

The light emitting layer EL may be provided on the entire surface of the substrate 101 to cover the anode electrodes AE and the bank 104.

The light emitting layer EL may include any one of an organic light emitting layer, an inorganic light emitting layer, and a quantum dot light emitting layer. Alternatively, the light emitting layer EL may include a stacked or mixed structure of an organic light emitting layer (or an inorganic light emitting layer) and a quantum dot light emitting layer.

The light emitting layer EL may include a hole injection layer HIL, a hole transport layer HTL, a hole blocking layer HBL, an electron injection layer EIL, an electron transport layer ETL, an electron blocking layer EBL, and a charge generation layer CGL.

If the light emitting layer EL outputs white colored light, the light emitting layer EL may include a (hole injection layer HIL/hole transport layer HTL), a blue organic layer, an (electron injection layer EIL/charge generation layer CGL/electron transport layer ETL), a red organic layer, a yellow green organic layer, an (electron injection layer EIL/charge generation layer CGL/electron transport layer ETL), a blue organic layer, an (electron injection layer EIL/electron transport layer ETL), and an organic buffer, which are sequentially stacked on the anode electrode AE.

In addition to the layers having a stacking order as described above, the light-emitting layer EL may alternatively be formed of layers having various other stacking orders.

The light emitting layer EL may be configured to output light having various colors, such as red, green, and blue. Alternatively, the light emitting layer EL may be configured to output white light.

The first cathode electrode CE1 may be provided on the upper surface of the light emitting layer EL. The first cathode electrode CE1 may be provided on the entire surface of the substrate 101.

The first cathode electrode CE1 may be the second pixel electrode of the organic light emitting diode. The first cathode electrode CE1 may be formed of a transparent electrode. For example, the first cathode electrode CE1 may be indium tin oxide (ITO) or indium zinc oxide (IZO).

The first cathode electrode CE1 may include the low resistance area electrode LE having the first resistance value and the high resistance area electrode HE having the second resistance value greater than the first resistance value.

The resistance value of the high resistance area electrode HE may be variously set so that electrons cannot move through the high resistance area electrode HE. The high resistance area electrode HE may function as an insulator.

The high resistance area electrode HE may function as an insulator because the amount of oxygen included in the high resistance area electrode HE may be greater than the amount of oxygen provided in the low resistance area electrode LE if the first cathode electrode CE1 is a transparent electrode.

To this end, in the process of forming the first cathode electrode CE1, oxygen may be injected into portions of the first cathode electrode CE1 where high resistance area electrodes HE are to be formed.

As shown in FIG. 7, the surface resistance may increase in accordance with the increase in oxygen. Therefore, the high resistance area electrode HE may have various values of resistance depending on the amount of oxygen injected. In particular, the resistance value of the high resistance area electrode HE may be variously configured such that the high resistance area electrode HE is capable of performing the function of the insulator.

Each of the high resistance area electrodes HE may be provided on any one of the banks 104.

The banks 104 may surround four sides of the anode electrode AE, as shown in FIGS. 4 to 6. Each of the high resistance area electrodes HE may be provided on a first region bank 104a between the two adjacent anode electrodes in the first direction X of the substrate 101, as shown in FIG. 4.

As shown in FIGS. 1, 3, and 4, the first direction X may be the transverse direction of the light emitting display panel 100 according to an example embodiment of the present disclosure.

As shown in FIG. 1, the gate lines GL1 to GLg disposed on the pixel driving circuit layer 102 may be provided along the first direction X of the substrate 101, and the data lines DL1 to DLd may be provided along the second direction Y different from the first direction X. For example, the data lines DL1 to DLd may be provided along the second direction Y which is perpendicular to the first direction X.

The amount of leakage current LLC between the adjacent pixels may be large between the pixels provided along a gate line. In this case, as shown in FIG. 4, each of the high resistance area electrodes HE may be provided on the first region bank 104a between the two adjacent anode electrodes in the first direction X of the substrate 101. In this case, as shown in FIGS. 5 and 6, electrons are not introduced into the light emitting layer EL provided on the upper surface of the bank 104 by the high resistance area electrode HE disposed on the bank 104. Therefore, since the leakage current LLC between the two pixels adjacent to each other is not generated, light is not output from the portion of the light emitting layer EL provided on the upper surface of the bank 104 and covered by the high resistance area electrode HE.

In the example light emitting display panel shown in FIG. 5, the first cathode electrode CE1 and the second cathode electrode CE2 may be in contact with each other at a contact area CA between the high resistance area electrode HE and the low resistance area electrode LE.

Accordingly, electrons introduced through the second cathode electrode CE2 may be transferred to the low resistance area electrode LE through the contact area CA, and light may be output from the light emitting layer EL between the low resistance area electrode LE and the anode electrode AE due to the electrons transferred to the low resistance area electrode LE.

Also, even if the second cathode electrode CE2 is directly formed on the upper end of the first cathode electrode CE1 as shown in FIG. 6, electrons introduced through the second cathode electrode CE2 may be transferred to the low resistance area electrode LE. Then, light from the light emitting layer EL between the low resistance area electrode LE and the anode electrode AE may be output due to the electrons transferred to the low resistance area electrode LE from the second cathode electrode CE2. In the example light emitting display panel shown in FIG. 6, since the first cathode electrode CE1 and the second cathode electrode CE2 are in contact with each other with all areas, all areas in which the low resistance area electrode LE and the second cathode electrode CE2 are in contact with each other may be the contact area CA.

On the other hand, in the example light emitting display panels shown in FIGS. 5 and 6, the high resistance area electrode HE may be provided on the upper surface of the bank 104. The high resistance area electrode HE may have a high resistance value so as to perform the function of an insulator. Thus, electrons may not be transferred to the high resistance area electrode HE which performs the function of the insulator. Due to the high resistance area electrode HE, electrons may not be transferred to the portion of the light emitting layer EL provided on the upper surface of the bank 104 and covered by the high resistance area electrode HE. Accordingly, light may not be output at the top of the bank 104. Thus, light may not be leaked to the upper end of the bank 104. In FIGS. 5 and 6, the arrow indicated in the first cathode electrode CE1 and the second cathode electrode CE2 represent the example direction of movement of the electrons.

The second cathode electrode CE2 may be connected to a second voltage supply portion to which the second voltage EVSS is supplied, and the first cathode electrode CE1 may be electrically connected to the second cathode electrode CE2 through the contact area CA. Therefore, electrons transferred from the second voltage supply portion to the second cathode electrode CE2 may be transferred to the low resistance area electrode LE through the contact area CA. The second cathode electrode CE2 may be electrically connected to the second voltage supply portion through a pad provided in the non-display area 130 of the light emitting display panel 100.

In this case, the first cathode electrode CE1 may be electrically connected to the second voltage supply portion through another pad provided in the non-display area 130 of the light emitting display panel 100. Alternatively, the first cathode electrode CE1 may be connected to the second cathode electrode CE2 via the contact area CA. In the following description, the example light emitting display panel connected to the second cathode electrode CE2 through the contact area CA is described as an example embodiment of the present disclosure.

Each of the high resistance area electrodes HE may be formed on the first region bank 104a provided between two adjacent anode electrodes in the first direction X of the substrate 101, as shown in FIG. 4. As illustrated in FIG. 3, the high resistance area electrodes HE may be provided in a line shape provided along the second direction Y perpendicular to the first direction X, and portions except the high resistance area electrode HE in the form of line in the first cathode electrode CE1 may be the low resistance area electrode LE.

In FIG. 3, the lines provided along the second direction Y are the high resistance area electrodes HE, and the remaining portions of the first cathode electrode CE1 except the high resistance area electrodes HE may be the low resistance area electrode LE.

As shown in FIG. 3, the pixels 110 may be disposed between two high resistance area electrodes HE adjacent to each other.

The high resistance area electrode HE may be disposed in the first region bank 104a provided between two specific adjacent pixels but not between all adjacent pixels.

In FIGS. 8A and 8B, a unit pixel composed of a red pixel R, a green pixel G, a white pixel W, and a blue pixel B is illustrated.

In this case, the high resistance area electrodes HE may be provided in the first region banks 104a provided between all the pixels.

Alternatively, as shown in FIG. 8B, the high resistance area electrodes HE may be disposed on the first region bank 104a located only between the specific pixels having large lateral leakage current (LLC) between the pixels. For example, the high resistance area electrode HE may be disposed only on the first region bank 104a provided between the white pixel W and the blue pixel B.

The banks 104 may surround four sides of the anode electrode AE in a plan view. In this case, each of the high resistance area electrodes HE may be disposed on the first region banks 104a located between the anode electrodes AE adjacent to each other in the first direction X of the substrate 101. Specifically, the high resistance area electrode HE may be disposed on the first region bank 104a located between two adjacent anode electrodes AE in the first direction X. The high resistance area electrode HE may extend in the second direction perpendicular to the first direction. If the red pixel R, the green pixel G, the white pixel W, and the blue pixel B are sequentially provided along the first direction X, the high resistance area electrode HE may be disposed only between the pixels having large leakage current LLC between the adjacent pixels. For example, the high resistance area electrode HE may be provided only on the first region bank 104a located between the white pixel W and the blue pixel B.

However, the present disclosure is not limited thereto. For example, the high resistance area electrodes HE may have the same shape in peripheral structure as that of the bank 104 surrounding the anode electrodes. For example, the high resistance area electrodes HE may be provided in the form of mesh. An example in which the high resistance area electrodes HE are arranged in a shape surrounding the anode electrodes along the bank 104 will be described later with reference to FIGS. 10B and 12B.

In addition, the high resistance area electrode HE may be provided at various locations necessary, desirable, or useful to block the leakage current between the adjacent pixels, in addition to the positions described above.

As shown in FIG. 5, a light compensation layer 105 may be provided on the first cathode electrode CE1. The light compensation layer 105 may be provided in a portion of the first cathode electrode CE1 corresponding to the anode electrode AE.

The light compensation layer 105 may perform a function of suppressing a color shift according to a viewing angle. Accordingly, as the light compensation layer 105 is formed, the color shift may be suppressed, and the color viewing angle characteristics may be improved.

The light compensation layer 105 may be formed of an organic material or an inorganic material, or an organic metal compound. For example, the light compensation layer 105 may be composed of one of TiOx, SiNx, SiO$_2$, TaO$_2$, NIOx, MgF and CaF. Alternatively, the light compensation layer 105 may be formed of a multi-layer structure in which at least two of TiOx, SiNx, SiO$_2$, TaO$_2$, NIOx, MgF and CaF are stacked.

In the present disclosure, the light compensation layer 105 may be used as a mask for forming the high resistance area electrode HE. Hereinafter, it will be described in detail with reference to FIGS. 9A to 9F.

The light compensation layer 105 and the high resistance area electrodes HE may be spaced apart from each other. In this case, the low resistance area electrode LE and the second cathode electrode CE2 may be connected to each other in the contact area CA where the light compensation layer 105 and the high resistance area electrodes HE are spaced apart from each other. The contact area CA may be included in the low resistance area electrode LE.

Therefore, the electrons supplied through the second cathode electrode CE2 may be transferred to the low resistance area electrode LE through the contact area CA, as shown for example by the arrow in FIG. 5. Then, light may be generated in the light emitting layer EL due to the electrons transferred to the low resistance area electrode LE.

As shown in FIG. 5, the light compensation layer 105 may be provided on the first cathode electrode CE1. Alternatively, as shown in FIG. 6, the second cathode electrode CE2 may be provided on the first cathode electrode CE1 without an intervening light compensation layer.

As shown in FIG. 6, the second cathode electrode CE2 may be provided on the upper surface of the first cathode electrode CE1. The second cathode electrode CE2 may contact the first cathode electrode CE1 in all areas of the first cathode electrode CE1. In this case, as shown for example by the arrow in FIG. 6, the electrons introduced through the second cathode electrode CE2 may be transferred to the low resistance area electrode LE. Then, light may be output from the light emitting layer EL between the low resistance area electrode LE and the anode electrode AE due to the electrons transferred to the low resistance area electrode LE. In the example light emitting display panel shown in FIG. 6, since the first cathode electrode CE1 and the second cathode electrode CE2 are in contact with each other at all areas, all areas in which the low resistance area electrode LE and the second cathode electrode CE2 are in contact to each other may be the contact area CA.

Since the electrons may not be transmitted in the high resistance area electrode HE, the electrons are not supplied to the high resistance area electrode HE disposed on the bank 104 from the second cathode electrode CE2. In this case, since the electrons are not transferred to the portion of the light emitting layer EL disposed between the upper surface of the bank 104 and the lower surface of the high resistance area electrode HE, light is not output from the upper surface of the bank 104. Therefore, in the light emitting layer EL provided on the upper surface of the bank 104, light caused by the leakage current is not generated.

The second cathode electrode CE2 may be formed in the shape of a plate on the display area 120 of the substrate 101. The second cathode electrode CE2 may be formed of a transparent electrode, such as indium tin oxide (ITO) or indium zinc oxide (IZO). Alternatively, the second cathode electrode CE2 may be formed of a conductive metal having a high transmittance.

If the light emitting layer EL emits white light, the second cathode electrode CE2 may be covered by a protection layer 108, and a color filter CF may be provided at a portion corresponding to the anode electrode AE on the upper surface of the protection layer 108. In addition, a black matrix BM may be provided at a portion corresponding to the bank 104 on the upper surface of the protection layer 108. Another protection layer 109 may be further provided on the black matrix BM and the color filter CF.

Each pixel may output any one of red light, green light, white light, and blue light with the use of the color filter CF.

If the light emitting layer EL emits light having an intrinsic color, the color filter CF may be omittable.

The protection layer 108 may function as an encapsulation layer. The protection layer 108 may be formed of at least one inorganic layer or at least one organic layer. Alternatively, the protection layer 108 may be formed by stacking at least one inorganic layer and at least one organic layer.

Another protection layer 109 may also be formed of at least one inorganic layer or at least one organic layer, or may alternatively be formed by stacking at least one inorganic layer and at least one organic layer.

FIGS. 9A to 9F are exemplary views illustrating a method of manufacturing the light emitting display panel according to an example embodiment of the present disclosure. FIGS. 10A and 10B are exemplary views illustrating a plan surface of the first cathode electrode generated in the manufacturing process of the light emitting display panel according to an example embodiment of the present disclosure. In particular, FIGS. 9A to 9F and FIGS. 10A and 10B are exemplary views for explaining the method of manufacturing the example light emitting display panel shown in FIG. 5. FIGS. 10A and 10B show a portion of the entire plan surface of the example light emitting display panel. In the following description, the same or similar content as described with reference to FIGS. 1 to 8 may be omitted or briefly described.

Figure 9A:
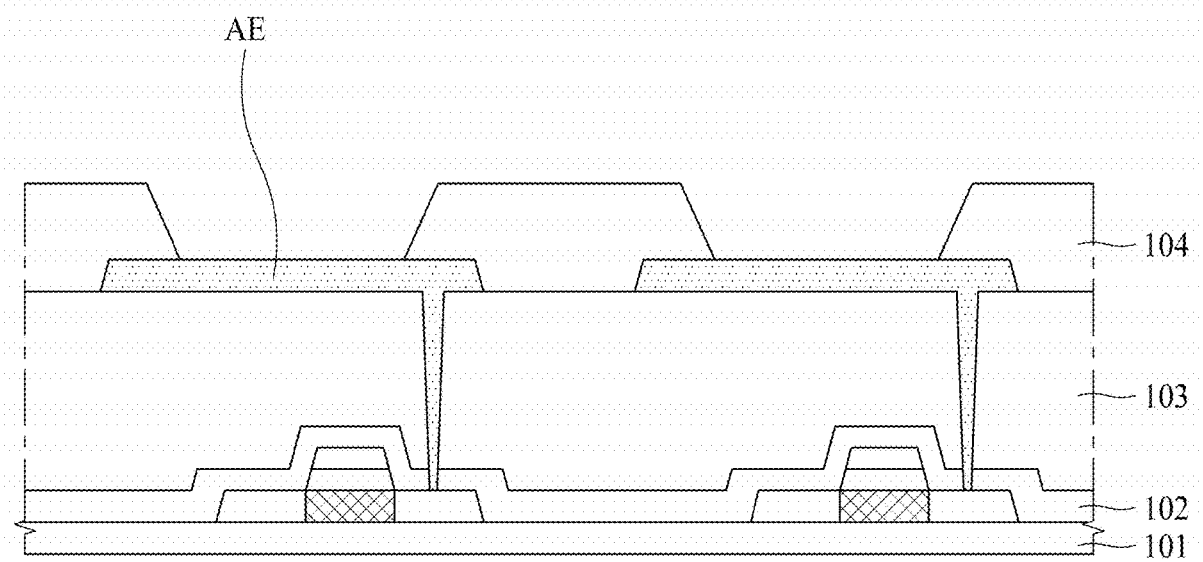
FIGS. 9A to 9F are exemplary views illustrating a method for manufacturing the light emitting display panel according to an example embodiment of the present disclosure.
Figure 10A:
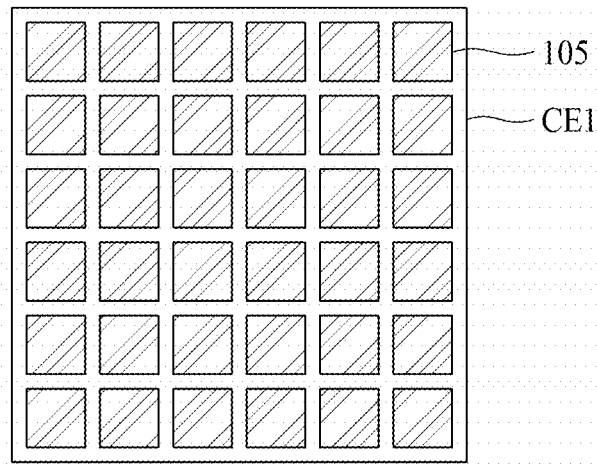
FIGS. 10A and 10B illustrate a plan surface of an example first cathode electrode generated in the manufacturing process of the light emitting display panel according to an example embodiment the present disclosure.
Figure 10B:
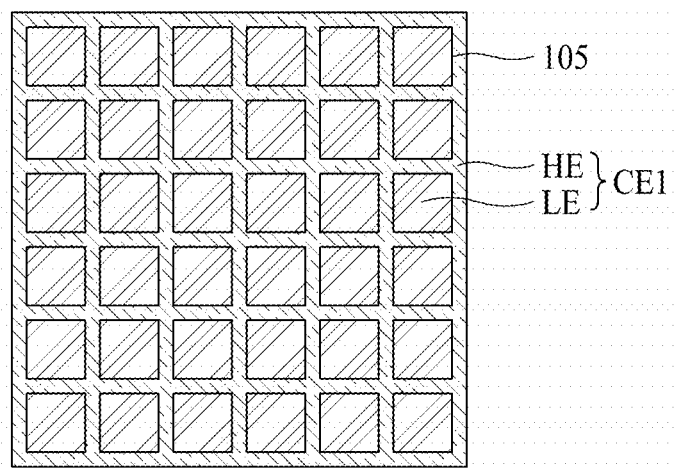

First, as shown in FIG. 9A, the pixel driving circuit layer 102 including the driving transistor Tdr may be provided in the substrate 101, and the pixel driving circuit layer 102 may be covered by the planarization layer 103.

The anode electrodes AE may be patterned on the planarization layer 103, and ends of the anode electrodes AE may be covered by the bank 104. The position of the pixels may be determined by the anode electrode AE and the bank 104.

Figure 9B:
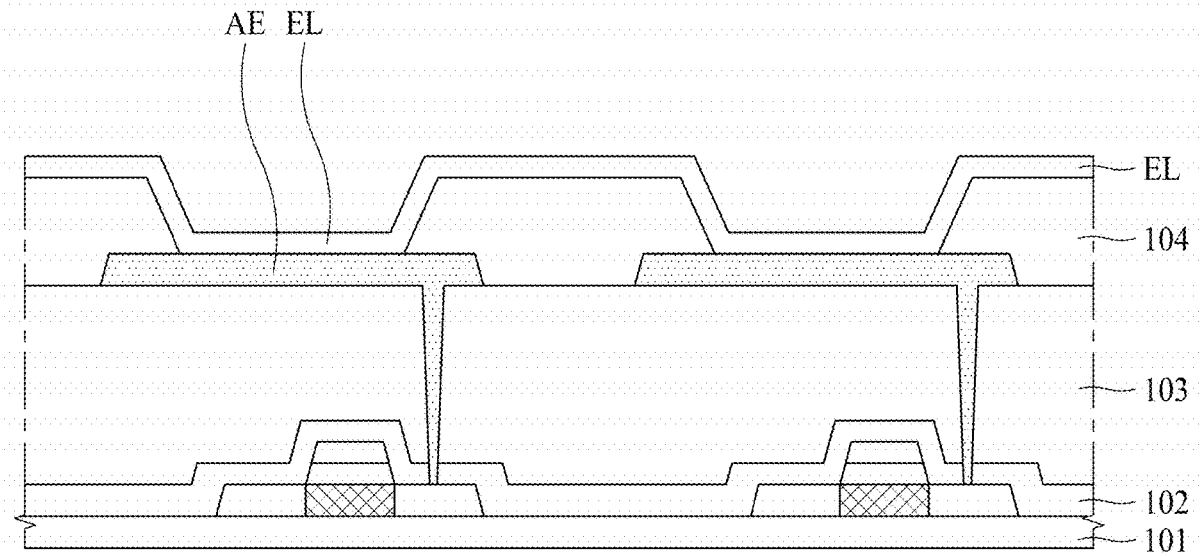

Next, as shown in FIG. 9B, the anode electrodes AE and the banks 104 may be covered by the light emitting layer EL. The light emitting layer EL may be formed in the shape of plate on the substrate 101 with the use of an open mask.

Figure 9C:
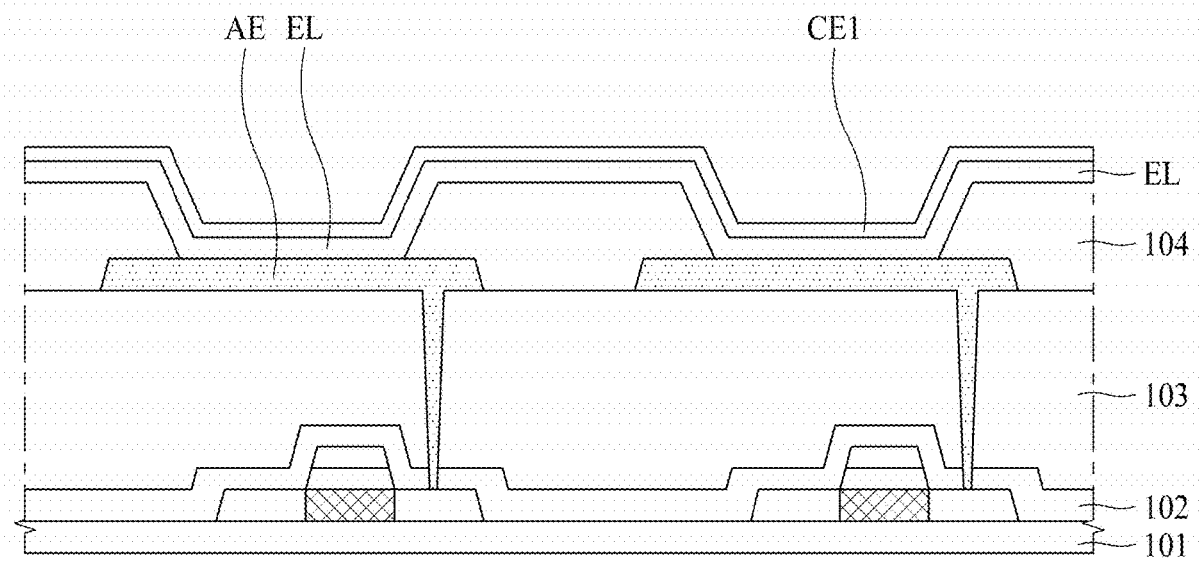

Then, as shown in FIG. 9C, the light emitting layer EL may be covered by the first cathode electrode CE1. The first cathode electrode CE1 may be formed in the shape of plate on the substrate 101 with the use of an open mask.

Figure 9D:
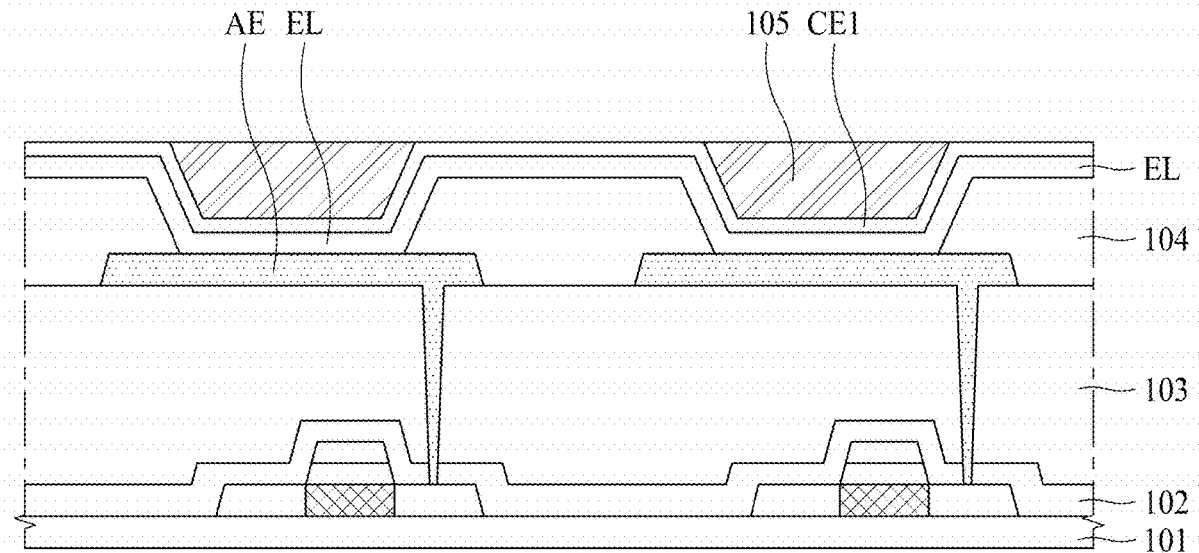

Next, as shown in FIG. 9D, the light compensation layer 105 may be provided on the first cathode electrode CE1 at a portion surrounded by the bank 104, that is, a portion corresponding to the upper surface of the anode electrode AE.

More specifically, the light compensation layer 105 may be provided in an opening region of the pixel. FIG. 10A shows a plan view of the example first cathode electrode CE1, and more particularly, the plan view where the example light compensation layer 105 may be provided in a portion corresponding to the upper surface of the anode electrode AE.

However, the light compensation layer 105 may also be provided at a portion of the upper surface of the bank 104.

Figure 9E:
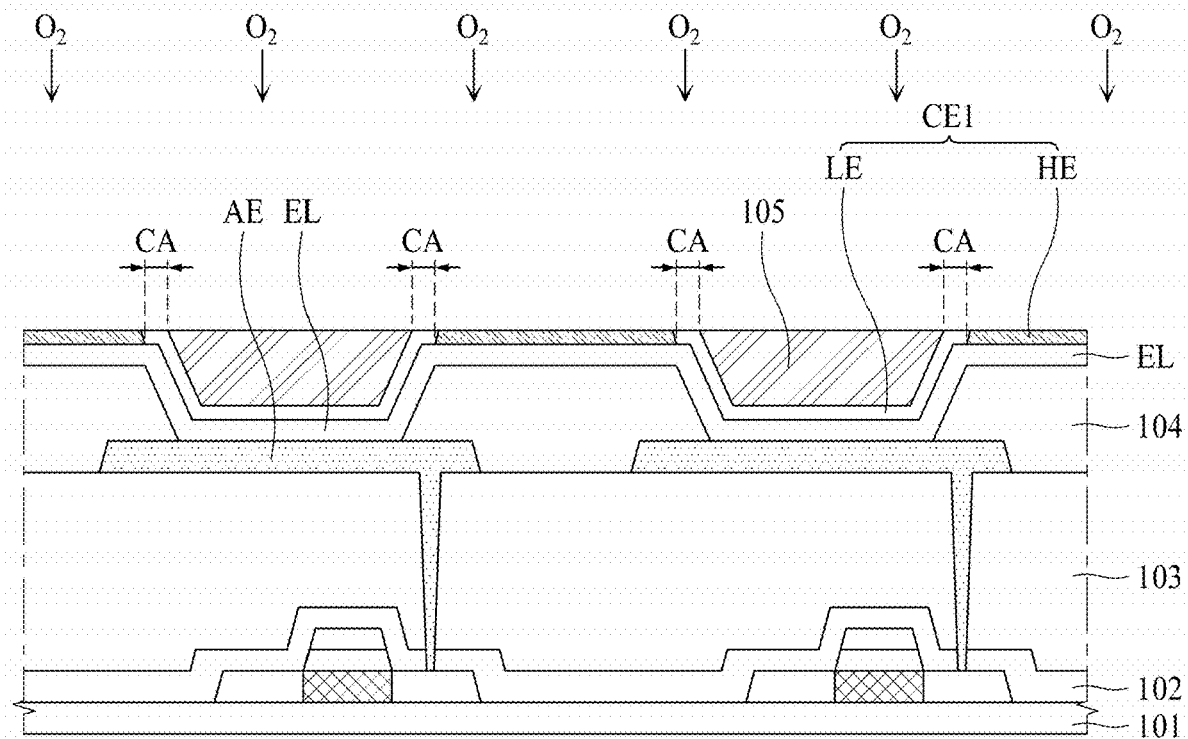

Next, as shown in FIG. 9E, oxygen (02) may be injected into the first cathode electrode CE1 and the light compensation layer 105 by a plasma process. Accordingly, the first cathode electrode CE1 may be divided into the high resistance area electrode HE and the low resistance area electrode LE. FIG. 10B shows a plan view of the example first cathode electrode CE1 which is divided into the high resistance area electrode HE and the low resistance area electrode LE with the use of the light compensation layer 105, and the light compensation layer 105 provided on the first cathode electrode CE1.

In this case, the high resistance area electrodes HE may be arranged on the banks 104 in a mesh form surrounding the anode electrodes AE.

Since the light compensation layer 105 may serve as a damage buffer layer, oxygen may not be injected to the first cathode electrode CE1 under the light compensation layer 105, and oxygen may be injected into a portion of the first cathode electrode CE1 which is not covered by the light compensation layer 105.

As described above with reference to FIG. 7, when oxygen is injected into the first cathode electrode CE1 formed of the transparent electrode, a resistance of the oxygen-injected portion may increase.

Therefore, the portion of the first cathode electrode CE1 not covered by the light compensation layer 105 may become the high resistance area electrode HE by the injected oxygen. Since oxygen is not injected into the remaining portion of the first cathode electrode CE1 covered by the light compensation layer 105, the resistance of the portion covered by the light compensation layer 105 may not change, whereby the portion covered by the light compensation layer 105 may become the low resistance area electrode LE.

In this case, the light compensation layer 105 and the high resistance area electrode HE may be spaced apart from each other. If oxygen is supplied by the plasma, the light compensation layer 105 may serve to block oxygen, and thus oxygen may not be supplied to areas directly under the light compensation layer 105. Accordingly, the portion of the first cathode electrode CE1 under the lower surface of the light compensation layer 105 is maintained as the low resistance area electrode LE. Also, since some of the oxygen is supplied to the first cathode electrode CE1 provided in the periphery of the light compensation layer 105, the resistance of the corresponding portion may be slightly increased. However, the increase in resistance may be sufficiently small such that the corresponding portion may be maintained at a low resistance. Thus, the portion of the first cathode electrode CE1 at the peripheral portion of the light compensation layer 105 may be maintained as part of the low resistance area electrode LE. However, since oxygen is directly supplied to a portion of the first cathode electrode CE1 spaced apart from the light compensation layer 105 by a predetermined distance, the corresponding portion may become the high resistance area electrode HE.

Accordingly, the light compensation layer 105 and the high resistance area electrode HE may be spaced apart from each other, and the first cathode electrode CE1 disposed at the area between the light compensation layer 105 and the high resistance area electrode HE may be part of the low resistance area electrode LE.

The area of the low resistance area electrode LE at the space between the light compensation layer 105 and the high resistance area electrode HE may be referred to as the contact area CA. The low resistance area electrode LE and the second cathode electrode CE2 may be electrically connected with each other via the contact area CA.

Figure 9F:
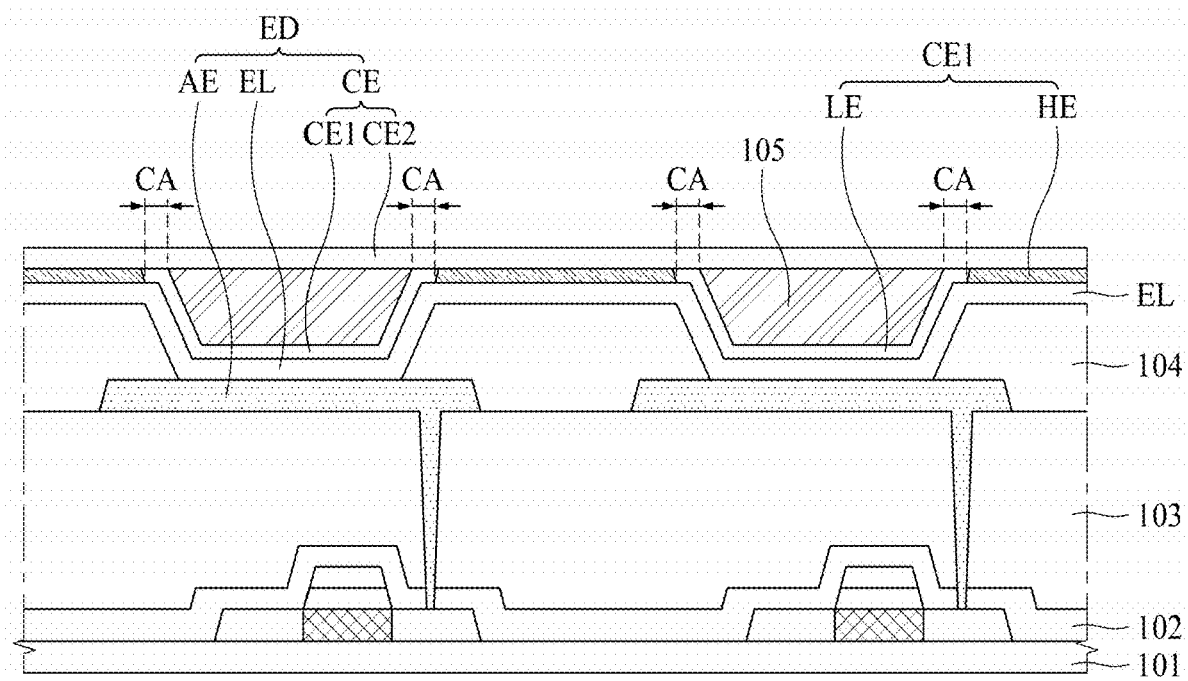

Next, as shown in FIG. 9F, the first cathode electrode CE1 and the light compensation layer 105 may be covered by the second cathode electrode CE2.

Finally, the second cathode electrode CE2 may be covered by the protection layer 108, thereby forming the example light emitting display panel as shown in FIG. 5. On the upper surface of the protection layer 108, the color filter CF, the black matrix BM, and another protection layer 109 may be provided.

Figure 11A:
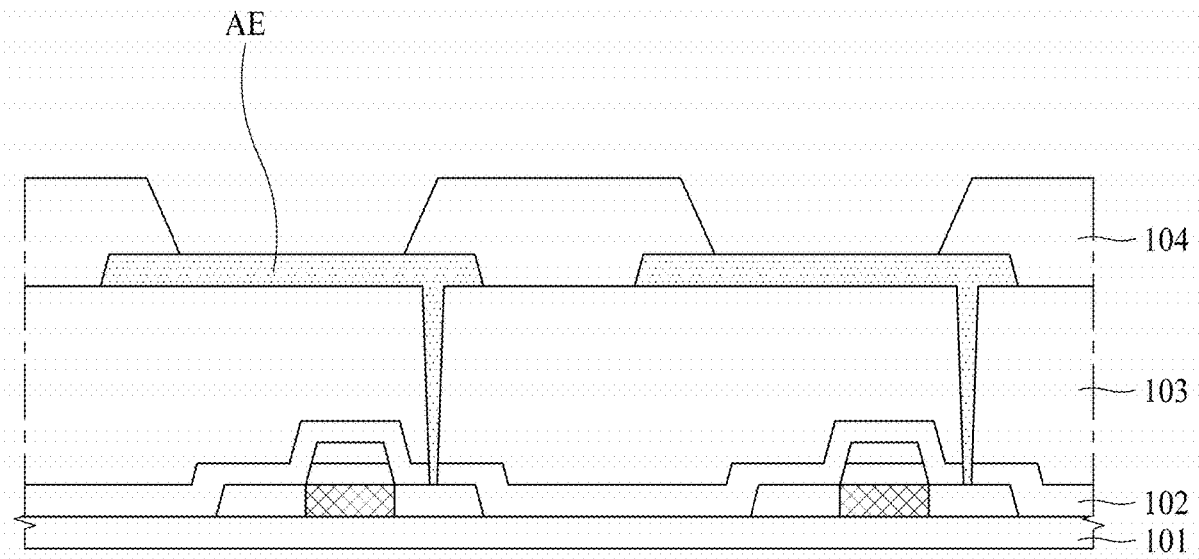
FIGS. 11A to 11G are cross sectional views illustrating a method for manufacturing a light emitting display panel according to another example embodiment of the present disclosure.
Figure 11B:
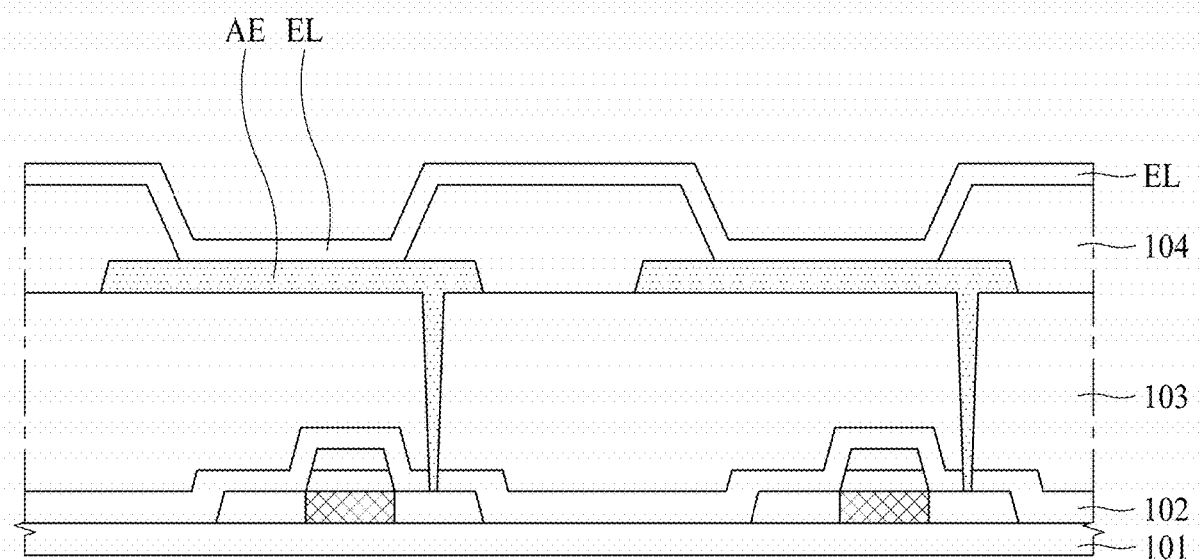
Figure 11C:
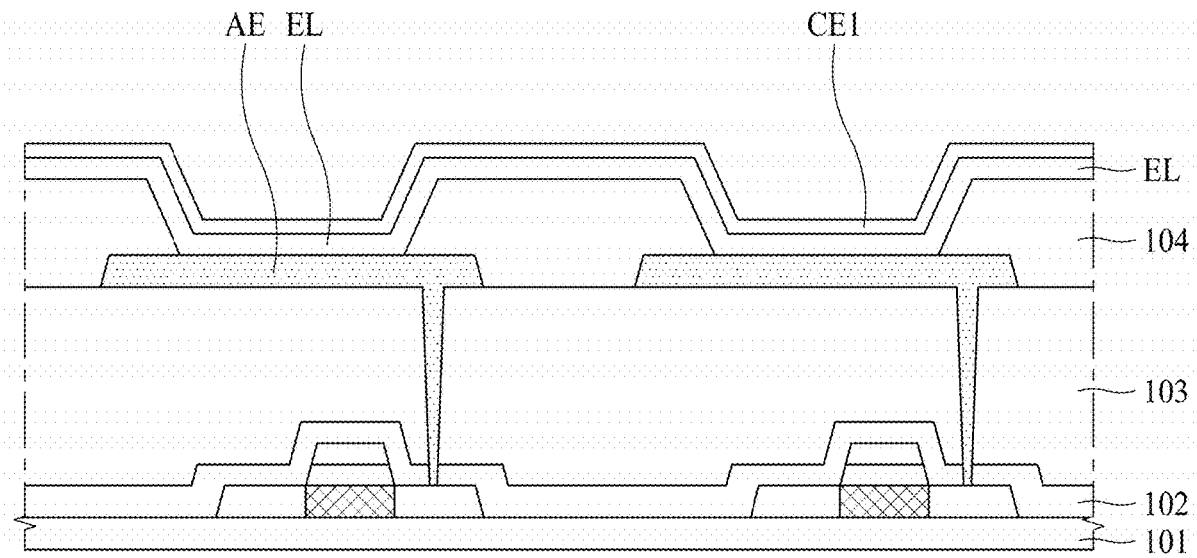
Figure 11D:
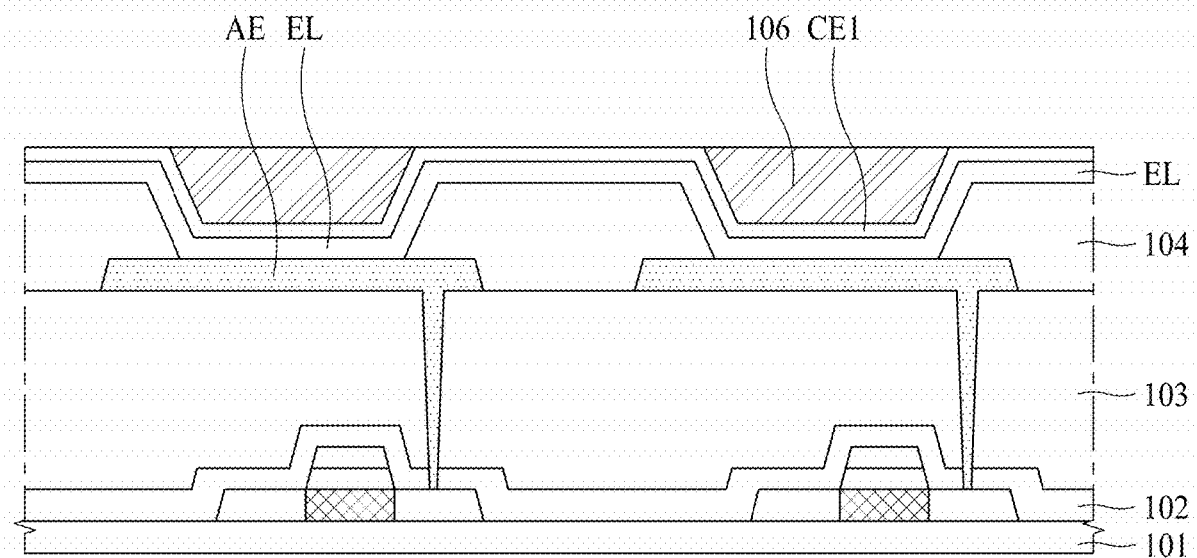
Figure 11E:
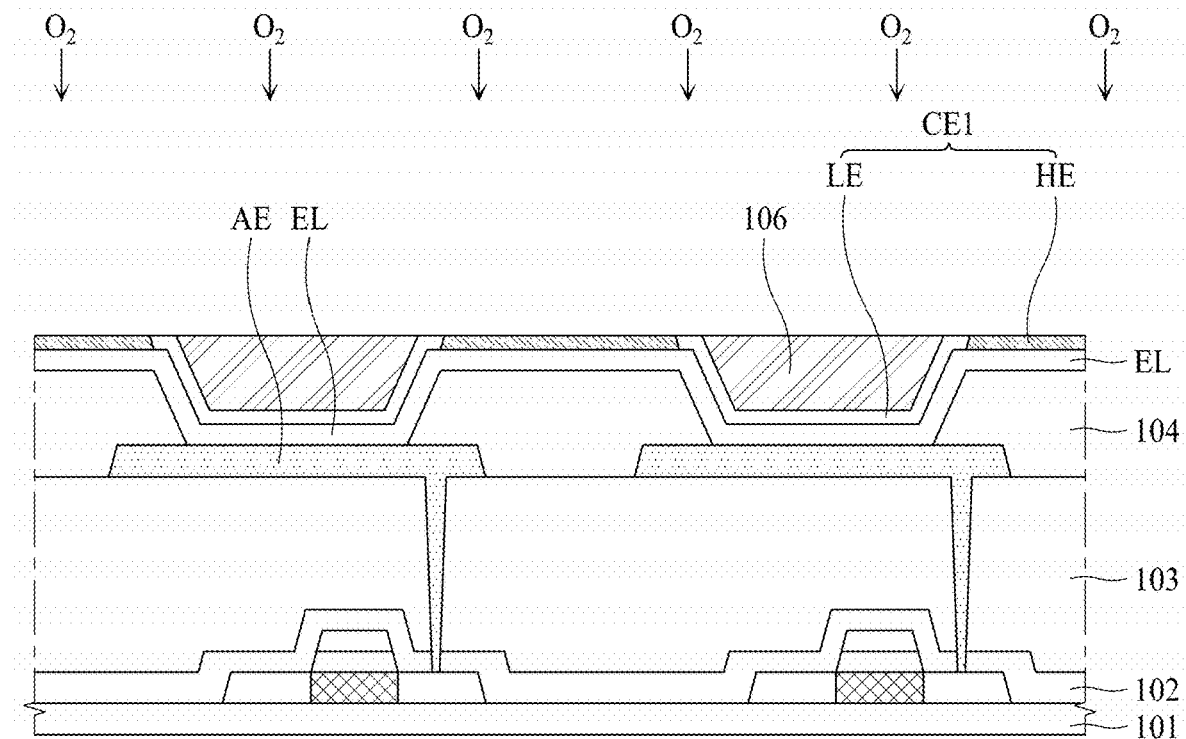
Figure 11F:
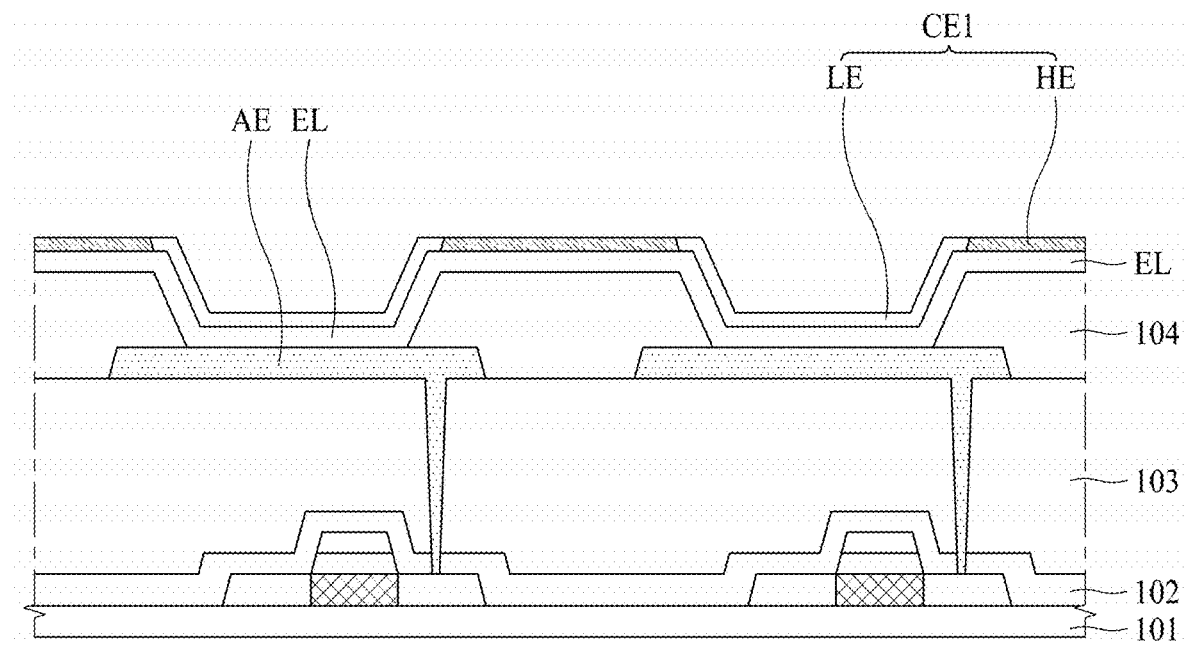
Figure 11G:
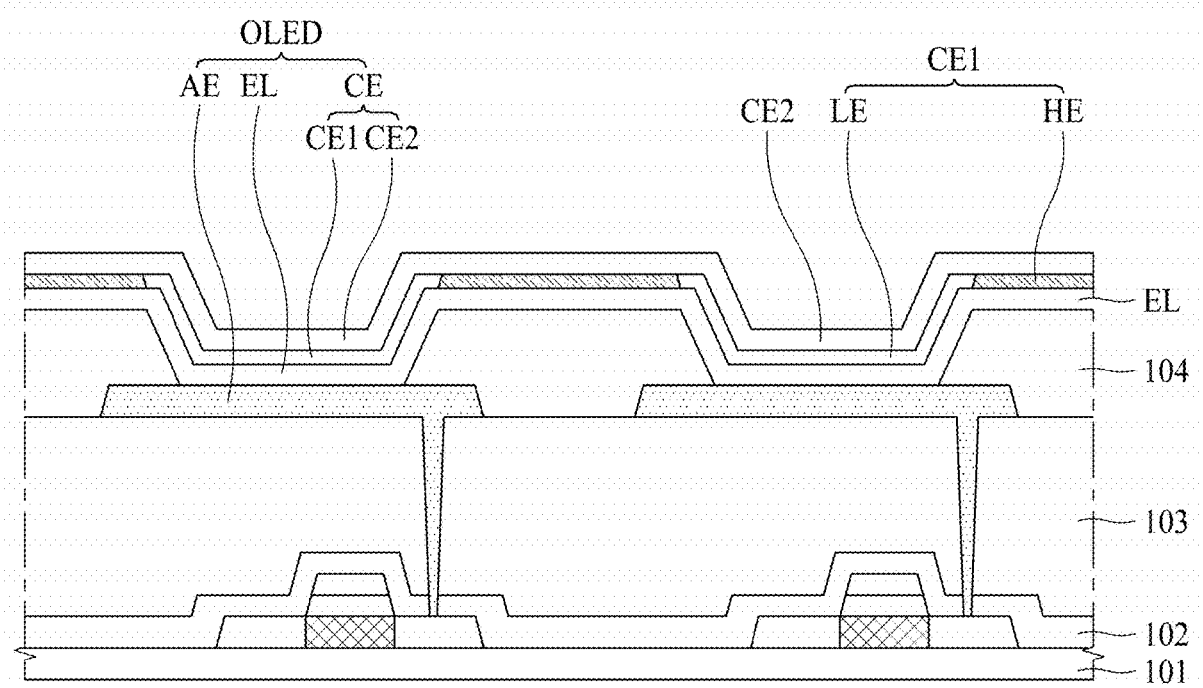
Figure 12A:
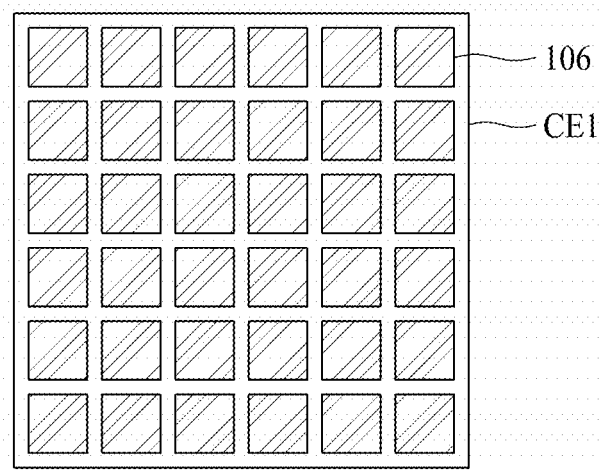
FIGS. 12A and 12B illustrate a plan surface of an example first cathode electrode generated in the manufacturing process of the light emitting display panel according to another example embodiment of the present disclosure.
Figure 12B:
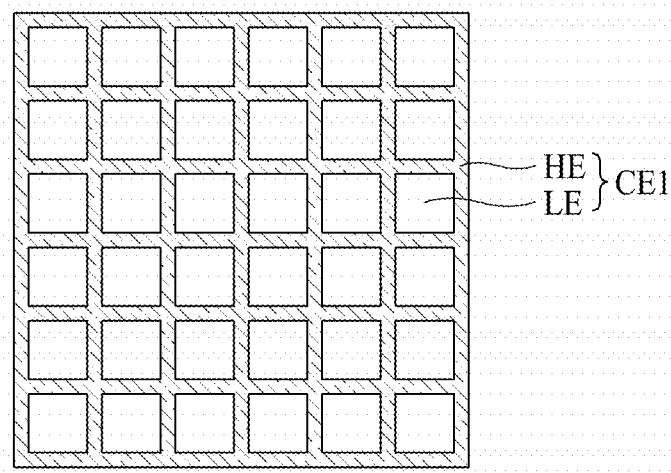

FIGS. 11A to 11G are cross sectional views illustrating a method of manufacturing a light emitting display panel according to another example embodiment of the present disclosure, and FIGS. 12A and 12B illustrate a plan view of another example first cathode electrode generated in a manufacturing process of the light emitting display panel according to an example embodiment of the present disclosure. In particular, FIGS. 11A to 11G, and FIGS. 12A and 12B are exemplary views for explaining a method of manufacturing the example light emitting display panel shown in FIG. 6. FIGS. 12A and 12B show a portion of the entire planar surface of the example light emitting display panel. In the following description, the same or similar content as described with reference to FIGS. 1 to 10B may be omitted or briefly described.

First, as shown in FIG. 11A, the pixel driving circuit layer 102 including the driving transistor Tdr may be provided on the substrate 101, and the pixel driving circuit layer 102 may be covered by the planarization layer 103.

The anode electrodes AE may be patterned on the planarization layer 103, and ends of the anode electrodes AE may be covered by the bank 104. The position of the pixels may be determined by the anode electrode AE and the bank 104.

Then, as shown in FIG. 11B, the anode electrodes AE and the banks 104 may be covered by the light emitting layer EL. The light emitting layer EL may be formed in a plate shape on the substrate 101 with the use of an open mask.

Next, as shown in FIG. 11C, the light emitting layer EL may be covered by the first cathode electrode CE1. The first cathode electrode CE1 may be formed in a plate shape on the substrate 101 with the use of an open mask.

Then, as shown in FIG. 11D, a pattern layer 106 may be provided on a portion of the first cathode electrode CE1 surrounded by the bank 104, that is, a portion corresponding to the upper surface of the anode electrode AE. The pattern layer 106 may be a photoresist or a buffer material.

More specifically, the pattern layer 106 may be provided in the opening region of the pixel. FIG. 12A shows a plan view of the example first cathode electrode CE1, and more particularly, a plan view of where the pattern layer 106 may be provided in the portion corresponding to the upper surface of the anode electrode AE.

However, the pattern layer 106 may also be provided on a portion of the upper surface of the bank 104.

Next, as shown in FIG. 11E, oxygen (O2) may be injected into the first cathode electrode CE1 and the pattern layer 106 by a plasma process. Accordingly, the first cathode electrode CE1 may be divided into the high resistance area electrode HE and the low resistance area electrode LE.

Since the pattern layer 106 may act as a damage buffer layer, oxygen may not be injected into the portion of the first cathode electrode CE1 under the pattern layer 106, and oxygen may be injected into a portion of the first cathode electrode CE1 not covered by the pattern layer 106.

As described above with reference to FIG. 7, when oxygen is injected into the first cathode electrode CE1 formed of the transparent electrode, the resistance of the oxygen-injected portion may increase.

Therefore, the portion of the first cathode electrode CE1 not covered by the pattern layer 106 may become the high resistance area electrode HE due to the injected oxygen. Since oxygen may not be injected into the portion of the first cathode electrode CE1 covered by the pattern layer 106, the resistance of the portion covered by the pattern layer 106 may not change, and thus the portion covered by the pattern layer 106 may become the low resistance area electrode HE.

In this case, the pattern layer 106 and the high resistance area electrode HE may be spaced apart from each other. When oxygen is supplied by the plasma, oxygen may not be supplied to the portion of the first cathode electrode CE1 directly under the pattern layer 106, and thus the first cathode electrode CE1 under the lower surface of the pattern layer 106 may be maintained as the low resistance area electrode LE. Also, since some oxygen may be supplied to the portion of the first cathode electrode CE1 provided at the periphery portion of the pattern layer 106, the resistance of the corresponding portion may be slightly increased. However, the increase in resistance may be sufficiently small such that the corresponding portion may be maintained at a low resistance. Accordingly, the portion of the first cathode electrode CE1 provided at the peripheral portion of the pattern layer 106 may be maintained as part of the low resistance area electrode LE. However, since oxygen may be directly supplied to the portion of the first cathode electrode CE1 spaced apart from the pattern layer 106 by a predetermined distance, the corresponding portion may become the high resistance area electrode HE.

Accordingly, the pattern layer 106 and the high resistance area electrode HE may be spaced apart from each other, and the portion of the first cathode electrode CE1 disposed at the space between the pattern layer 106 and the high resistance area electrode HE may be part of the low resistance area electrode LE.

Next, as shown in FIG. 11F, the pattern layer 106 may be removed from the upper end of the first cathode electrode CE1. As illustrated in FIG. 12B, after the pattern layer 106 provided on the first cathode electrode CE1 is removed, the first cathode electrode CE1 may be divided into the high resistance area electrode HE and the low resistance area electrode LE.

The portion of the first cathode electrode CE1 from which the pattern layer 106 is removed and the periphery thereof may become the low resistance area electrode LE, and the remaining portions may become the high resistance area electrode HE.

In this case, the high resistance area electrodes HE may be arranged on the banks 104 in a mesh shape surrounding the anode electrodes AE.

Next, as shown in FIG. 11G, the first cathode electrode CE1 may be covered by the second cathode electrode CE2.

Accordingly, the low resistance area electrode LE may be in close contact with the second cathode electrode CE2, and a portion where the low resistance area electrode LE and the second cathode electrode CE2 are in close contact may be referred to as the contact area CA. The low resistance area electrode LE and the second cathode electrode CE2 may be electrically connected to each other through the contact area CA.

Finally, the second cathode electrode CE2 may be covered by the protection layer 108, thereby forming the example light emitting display panel as shown in FIG. 6. On the upper surface of the protection layer 108, the color filter CF, the black matrix BM, and another protection layer 109 may be provided.

According to example embodiments of the present disclosure as described above, the leakage current LLC between the adjacent pixels may be reduced, thereby preventing light leakage occurring in the adjacent pixels.

The resistance of the high resistance area electrode HE may be greater than the resistance of the low resistance area electrode LE. In this case, since electrons transmitted through the second cathode electrode CE2 may not pass through the high resistance area electrode HE provided at the upper surface of the bank 104, electrons may not be supplied to the portion of the light emitting layer EL on the upper surface of the bank 104, thereby preventing light leakage at the upper surface of the bank 104. In addition, since electrons transmitted through the second cathode electrode CE2 may be supplied to the low resistance area electrode LE provided in the opening of the pixel between the banks 104 through the contact area CA having a low resistance, a luminous efficiency at the opening may be increased.

In addition, according to example embodiments of the present disclosure, since the second cathode electrode CE2 having a low resistance may be provided on the entire surface of the substrate 101, and the low resistance area electrode LE having a low resistance may be provided in the opening of the pixel, there may be no need for an auxiliary electrode for securing resistance. Therefore, in example embodiments of the present disclosure, there may be no need to form a contact hole for connecting the auxiliary electrode and the cathode electrode, thereby increasing an aperture ratio by as much as the area where the contact hole would otherwise be formed.

According to example embodiments of the present disclosure, since an aperture ratio loss may be reduced, the present disclosure may be applied to a high-resolution model.

According to example embodiments of the present disclosure, the leakage current LLC between the adjacent pixels may be reduced, thereby preventing light leakage occurring in the adjacent pixels.

According to example embodiments of the present disclosure, the cathode electrode having a low resistance may be provided, such that there may be no need for an auxiliary electrode for securing resistance. Therefore, in example embodiments of the present disclosure, there may be no need to form a contact hole for connecting the auxiliary electrode and the cathode electrode, thereby increasing an aperture ratio by as much as the area where the contact hole would otherwise be formed.

The above-described features, structures, and effects of the present disclosure are included in at least one example embodiment of the present disclosure, but are not limited to only one example embodiment. Furthermore, the features, structures, and effects described in at least one example embodiment of the present disclosure may be implemented through combination with or modification of other embodiments by those skilled in the art. Therefore, content associated with the combination and modification should be construed as being within the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents.

What is claimed is:

1. A light emitting display panel, comprising:
a substrate;
a plurality of pixel driving circuits on the substrate;
a planarization layer on the pixel driving circuits;
a plurality of anode electrodes on the planarization layer, each of the plurality of anode electrodes being electrically connected with a corresponding one of the pixel driving circuits;
a plurality of banks on the planarization layer and including at least one first region bank between two adjacent anode electrodes among the plurality of anode electrodes, the at least one first region bank having a top surface and two opposing side surfaces extending downward from the top surface;
a light emitting layer on the plurality of anode electrodes and on the banks;
a first cathode electrode on the light emitting layer and including:
a low resistance area electrode overlapping at least one of the two adjacent anode electrodes in a plan view; and
at least one high resistance area electrode having a higher resistance than the low resistance area electrode, the at least one high resistance area electrode overlapping the top surface of the at least one first region bank without overlapping any of the two opposing side surfaces of the at least one first region bank in the plan view; and
a second cathode electrode on the first cathode electrode,
wherein the light emitting layer is disposed between the at least one high resistance area electrode and the top surface of the at least one first region bank and is disposed between the low resistance area electrode and the plurality of anode electrodes, and
wherein the second cathode electrode is disposed on the at least one high resistance area electrode of the first cathode electrode and disposed on the low resistance area electrode of the first cathode electrode, the second cathode electrode extending continuously over the first cathode electrode in a cross-sectional view from being disposed on the at least one high resistance area electrode to being disposed on the low resistance area electrode.

2. The light emitting display panel of claim 1, wherein the banks surround the plurality of anode electrodes, and
wherein the at least one high resistance area electrode is disposed on the at least one first region bank, which is between the two adjacent anode electrodes in a first direction of the substrate.

3. The light emitting display panel of claim 2, wherein the pixel driving circuits include a plurality of gate lines extending along the first direction of the substrate.

4. The light emitting display panel of claim 1, wherein the banks surround the plurality of anode electrodes,
wherein the banks include a plurality of first region banks, and
wherein the at least one high resistance area electrode is disposed on at least one of the first region banks but not on another of the first region banks.

5. The light emitting display panel of claim 4, wherein the substrate includes a plurality of pixels, each of the pixels including a corresponding one of the plurality of anode electrodes,
wherein the pixels include a red pixel, a green pixel, a white pixel, and a one blue pixel sequentially disposed along a first direction, and
wherein the at least one high resistance area electrode is disposed on the at least one of the first region banks between the white pixel and the blue pixel in the first direction, but is not disposed on the another of the first region banks between the red pixel and the green pixel or between the green pixel and the white pixel.

6. The light emitting display panel of claim 1, wherein the first cathode electrode layer includes a plurality of high resistance area electrodes, the high resistance area electrodes being on the banks and surrounding the anode electrodes.

7. The light emitting display panel of claim 1, further comprising a light compensation layer between the first cathode electrode and the second cathode electrode.

8. The light emitting display panel of claim 7, wherein the light compensation layer includes at least one of TiOx, SiNx, $SiO_2$, $TaO_2$, NIOx, MgF and CaF.

9. The light emitting display panel of claim 7, wherein the light compensation layer is disposed between the banks and is spaced apart from the at least one high resistance area electrode in the plan view, and wherein the low resistance area electrode and the second cathode electrode are connected with each other at a contact area of the low resistance area electrode between the light compensation layer and the at least one high resistance area electrode in the plan view.

10. The light emitting display panel of claim 1, wherein each of the pixel driving circuits includes at least one of a switching transistor, a driving transistor, a sensing transistor, and a storage capacitor.

11. The light emitting display panel of claim 1, wherein the first cathode electrode is a transparent electrode, and the amount of oxygen in the at least one high resistance area electrode is larger than the amount of oxygen in the low resistance area electrode.

12. The light emitting display panel of claim 1, further comprising:
a protection layer on the second cathode electrode;
a color filter on a portion of the protection layer above the plurality of anode electrodes; and
a black matrix on another portion of the protection layer above the banks,
wherein the light emitting layer is configured to output white light.

13. A light emitting display apparatus, comprising:
the light emitting display panel of claim 1;
a data driver configured to supply data voltages to data lines disposed in the light emitting display panel;
a gate driver configured to supply a gate voltage to gate lines disposed in the light emitting display panel; and
a controller configured to control the data driver and the gate driver.

14. The light emitting display panel of claim 1, wherein the low resistance area electrode surrounds the at least one high resistance area electrode in the plan view.

15. The light emitting display panel of claim 1, wherein:
the first cathode electrode further includes a plurality of other low resistance area electrodes; and
the at least one high resistance area electrode has a mesh shape surrounding the low resistance area electrode and the plurality of other low resistance area electrodes in the plan view.

* * * * *